(12) United States Patent
Kim et al.

(10) Patent No.: US 12,538,722 B2
(45) Date of Patent: Jan. 27, 2026

(54) DISPLAY DEVICE AND METHOD OF FABRICATING THE SAME

(71) Applicant: Samsung Display Co., LTD., Yongin-si (KR)

(72) Inventors: Sang Sub Kim, Suwon-si (KR); Keun Woo Kim, Seongnam-si (KR); Ji Yeong Shin, Suwon-si (KR); Yong Su Lee, Seoul (KR); Myoung Geun Cha, Seoul (KR); Ki Seok Choi, Seoul (KR); Sang Gun Choi, Suwon-si (KR)

(73) Assignee: Samsung Display Co., LTD., Yongin-si (KR)

( * ) Notice: Subject to any disclaimer, the term of this patent is extended or adjusted under 35 U.S.C. 154(b) by 0 days.

(21) Appl. No.: 18/665,023

(22) Filed: May 15, 2024

(65) Prior Publication Data
US 2024/0304726 A1 Sep. 12, 2024

Related U.S. Application Data

(62) Division of application No. 18/122,815, filed on Mar. 17, 2023, now Pat. No. 12,015,088, which is a
(Continued)

(30) Foreign Application Priority Data

Nov. 20, 2019 (KR) .......... 10-2019-0149743

(51) Int. Cl.
*H01L 21/265* (2006.01)
*H10D 30/01* (2025.01)
(Continued)

(52) U.S. Cl.
CPC ... *H01L 21/26533* (2013.01); *H10D 30/0321* (2025.01); *H10D 86/0223* (2025.01);
(Continued)

(58) Field of Classification Search
CPC ......... H01L 21/02164; H01L 21/02225; H01L 21/02227; H01L 21/02381; H01L 21/2253;
(Continued)

(56) References Cited

U.S. PATENT DOCUMENTS 5,773,331 A 6/1998 Solomon et al.
7,115,950 B2 10/2006 Tokushige
(Continued)

FOREIGN PATENT DOCUMENTS

JP 2005-72144 3/2005
KR 2000-0014381 3/2000
(Continued)

OTHER PUBLICATIONS

Y. Omura et al., "0.1-μm-Gate, Ultrathin-Film CMOS Devices Using SIMOX Substrate with 80-nm-Thick Buried Oxide Layer", 1991 IEEE Int. Electron Devices Meeting, Tech. Dig., 1991, pp. 675-678.

*Primary Examiner* — Eduardo A Rodela
(74) *Attorney, Agent, or Firm* — F. CHAU & ASSOCIATES, LLC

(57) ABSTRACT

A display device and method of fabricating the same are provided. The display device includes a substrate and a thin-film transistor formed on the substrate. The thin-film transistor includes a lower gate conductive layer disposed on the substrate, and a lower gate insulating film disposed on the lower gate conductive layer The lower gate insulating film includes an upper surface and sidewalls. The thin-film transistor includes an active layer disposed on the upper surface of the lower gate insulating film, the active layer including sidewalls. At least one of the sidewalls of the lower gate insulating film and at least one of the sidewalls of the active layer are aligned with each other.

9 Claims, 24 Drawing Sheets

Related U.S. Application Data division of application No. 17/071,579, filed on Oct. 15, 2020, now Pat. No. 11,626,429.

(51) Int. Cl.
| | |
|---|---|
| *H10D 86/01* | (2025.01) |
| *H10K 59/121* | (2023.01) |
| *H01L 21/225* | (2006.01) |
| *H01L 21/28* | (2006.01) |
| *H10D 86/40* | (2025.01) |
| *H10D 86/60* | (2025.01) |
| *H10K 59/12* | (2023.01) |

(52) U.S. Cl.
CPC ...... *H10K 59/1213* (2023.02); *H01L 21/2253* (2013.01); *H01L 21/28158* (2013.01); *H10D 86/481* (2025.01); *H10D 86/60* (2025.01); *H10K 59/1201* (2023.02)

(58) Field of Classification Search
CPC ........... H01L 21/2257; H01L 21/26533; H01L 21/28158; H01L 21/28008; H10D 30/6758; H10D 30/0321; H10D 86/0223; H10D 86/481; H10D 86/60; H10D 30/6734; H10D 30/6704; H10D 30/6743; H10D 30/6744; H10D 30/6755; H10D 30/6757; H10D 86/0212; H10D 86/431; H10K 59/1213; H10K 59/1201; G09G 3/32; G09G 2300/0809; G09G 3/3233; G09G 2300/0814; G09G 2300/0819; G09G 2300/0842; G09G 2300/0861
See application file for complete search history.

(56) References Cited

U.S. PATENT DOCUMENTS

| | | | |
|---|---|---|---|
| 7,297,977 | B2 | 11/2007 | Hoffman et al. |
| 8,247,811 | B2 | 8/2012 | Morosawa et al. |
| 8,574,982 | B2 | 11/2013 | Erickson et al. |
| 9,218,957 | B2 | 12/2015 | Li et al. |
| 9,583,551 | B2 * | 2/2017 | Zhang .............. H10K 59/80524 |
| 9,934,723 | B2 | 4/2018 | Lee et al. |
| 10,312,271 | B2 * | 6/2019 | Liu ........................ H10K 59/00 |
| 11,404,585 | B2 | 8/2022 | Yamamoto et al. |
| 2002/0113264 | A1 | 8/2002 | Horikoshi et al. |
| 2007/0232003 | A1 * | 10/2007 | Loo .................... H10D 30/0212 |
| | | | 257/E21.429 |
| 2011/0104833 | A1 | 5/2011 | Kang et al. |
| 2013/0075731 | A1 | 3/2013 | Han et al. |
| 2013/0334533 | A1 | 12/2013 | Yamazaki |
| 2015/0041803 | A1 | 2/2015 | Endo et al. |
| 2016/0148984 | A1 | 5/2016 | Kim et al. |
| 2018/0012947 | A1 | 1/2018 | Lee et al. |
| 2018/0233597 | A1 | 8/2018 | Yamamoto et al. |
| 2020/0235246 | A1 | 7/2020 | Sharma et al. |
| 2021/0280719 | A1 | 9/2021 | Kim et al. |
| 2021/0384276 | A1 | 12/2021 | Imai et al. |

FOREIGN PATENT DOCUMENTS

| | | |
|---|---|---|
| KR | 10-0710800 | 4/2007 |
| KR | 10-1071712 | 10/2011 |
| KR | 10-1543829 | 8/2015 |

* cited by examiner

DT : 120,131,140,161,162

DISPLAY DEVICE AND METHOD OF FABRICATING THE SAME

CROSS REFERENCE TO RELATED APPLICATION(S)

This is a divisional application of U.S. patent application Ser. No. 18/122,815, filed Mar. 17, 2023 (now pending), the entire contents of which are incorporated herein by reference. U.S. patent application Ser. No. 18/122,815 is a divisional application of U.S. patent application Ser. No. 17/071,579, filed Oct. 15, 2020, now U.S. Pat. No. 11,626,429, issued Apr. 11, 2023, the entire contents of which are incorporated herein by reference. U.S. patent application Ser. No. 17/071,579 claims priority to and benefits of Korean Patent Application No. 10-2019-0149743 under 35 U.S.C. § 119, filed on Nov. 20, 2019 in the Korean Intellectual Property Office, the entire contents of which are incorporated herein by reference for all purposes.

BACKGROUND

1. Technical Field

The disclosure relates to a display device and a method of fabricating the same.

2. Description of the Related Art

With development into an information society, various demands are increasing on display devices for displaying images. For example, display devices are being applied to various electronic devices such as smartphones, digital cameras, notebook computers, navigation devices, and smart televisions. Display devices may be flat panel display devices such as liquid crystal display devices, field emission display devices, and organic light-emitting display devices. In organic light-emitting display devices, since pixels of display panels may include light-emitting elements capable of emitting light by themselves, the organic light-emitting display devices can display images even without a backlight which, in other types of display panels, may provide light.

An organic light-emitting display device may include pixels. The pixels may include a light-emitting element, a driving transistor that adjusts an amount of driving current supplied through a power supply line to the light-emitting element according to a voltage of a gate electrode thereof, and a scan transistor that supplies a data voltage through a data line to the gate electrode of the driving transistor in response to a scan signal of a scan line.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

According to an embodiment of the disclosure, a display device may include a substrate and a thin-film transistor disposed on the substrate. The thin-film transistor may include a lower gate conductive layer disposed on the substrate, and a lower gate insulating film disposed on the lower gate conductive layer, the lower gate insulating film including an upper surface and sidewalls. The thin-film transistor may include an active layer disposed on the upper surface of the lower gate insulating film, the active layer including sidewalls. At least one of the sidewalls of the lower gate insulating film and at least one of the sidewalls of the active layer may be aligned with each other.

In an embodiment, the active layer may completely cover the upper surface of the lower gate insulating film.

In an embodiment, the lower gate insulating film may be disposed to expose at least a portion of the substrate.

In an embodiment, the display device may include a buffer layer disposed between the lower gate conductive layer and the lower gate insulating film, wherein the buffer layer may be disposed on an entire surface of the substrate.

In an embodiment, the active layer may include polycrystalline silicon, the lower gate insulating film may include silicon oxide, the buffer layer may include a silicon oxide film, and an oxygen content of the lower gate insulating film may be higher than an oxygen content of the buffer layer.

In an embodiment, the thin-film transistor may include an upper gate insulating film disposed on the active layer, an upper gate conductive layer disposed on the upper gate insulating film, an interlayer insulating film disposed on the upper gate conductive layer, a first electrode of the thin-film transistor, and a second electrode of the thin-film transistor.

In an embodiment, the first electrode and the second electrode may form a conductive layer disposed on the interlayer insulating film.

In an embodiment, the active layer may include a first doped region, a second doped region, and a channel region disposed between the first doped region and the second doped region, wherein the first electrode and the second electrode of the thin-film transistor may be electrically connected to the first doped region and the second doped region, respectively.

In an embodiment, a region in which the first electrode of the thin-film transistor may be electrically connected to the first doped region and a region in which the second electrode of the thin-film transistor may be electrically connected to the second doped region overlap the lower gate insulating film.

According to another embodiment of the disclosure, a method of fabricating a display device may include forming an amorphous silicon pattern on a substrate, implanting oxygen into a lower portion of the amorphous silicon pattern, and dividing the amorphous silicon pattern into which the oxygen may be implanted into a lower gate insulating film and an active layer disposed above the lower gate insulating film. The active layer may include crystalline silicon.

In an embodiment, the forming of the amorphous silicon pattern on the substrate may include forming an amorphous silicon layer on the substrate, and patterning the amorphous silicon layer to form the amorphous silicon pattern.

In an embodiment, the dividing of the amorphous silicon pattern into which the oxygen may be implanted may include forming the active layer by crystallizing an upper portion of the amorphous silicon pattern into which the oxygen may be implanted, and forming the lower gate insulating film by heat-treating the lower portion of the amorphous silicon pattern into which the oxygen may be implanted.

In an embodiment, the method fabricating the display device may include forming a buffer layer on an entire surface of the substrate prior to the forming of the amorphous silicon pattern on the substrate, wherein the forming of the amorphous silicon pattern may include forming the amorphous silicon pattern on the buffer layer.

In an embodiment, the buffer layer may include silicon oxide, and an oxygen content of the lower gate insulating film may be higher than an oxygen content of the buffer layer.

In an embodiment, the dividing of the amorphous silicon pattern may include forming the active layer above the lower gate insulating film to completely cover an upper surface of the lower gate insulating film.

In an embodiment, the forming of the active layer may include aligning at least one of sidewalls of the active layer with at least one of sidewalls of the lower gate insulating film.

In an embodiment, the method may include heat-treating the lower gate insulating film after the dividing of the amorphous silicon pattern into which the oxygen may be implanted.

According to another embodiment of the disclosure, a method of fabricating a display device may include forming a crystalline silicon pattern on a substrate, forming an upper gate insulating film on the crystalline silicon pattern, and dividing the crystalline silicon pattern into a lower gate insulating film and an active layer disposed on the lower gate insulating film. The active layer may include crystalline silicon. The dividing of the crystalline silicon pattern may include forming the active layer above the lower gate insulating film to completely cover an upper surface of the lower gate insulating film, and aligning at least one of sidewalls of the active layer with at least one of sidewalls of the lower gate insulating film.

In an embodiment, the forming of the crystalline silicon pattern on the substrate may include forming an amorphous silicon layer on the substrate, patterning the amorphous silicon layer to form an amorphous silicon pattern, and crystallizing the amorphous silicon pattern to form the crystalline silicon pattern.

In an embodiment, the dividing of the crystalline silicon pattern may include implanting oxygen into a lower portion of the crystalline silicon pattern, and dividing the lower portion of the crystalline silicon pattern from an upper portion of the crystalline silicon pattern by forming the lower portion of the crystalline silicon pattern as the lower gate insulating film through heat treatment, the upper portion of the crystalline silicone pattern being the active layer including the crystalline silicon.

In an embodiment, the method may further include, prior to the forming of the crystalline silicon pattern on the substrate, forming a lower gate conductive layer on the substrate, and forming a buffer layer on the lower gate conductive layer and the substrate. The lower gate conductive layer may be disposed below the crystalline silicon pattern to overlap the crystalline silicon pattern, and the buffer layer may be disposed on an entire surface of the substrate and may be disposed between the crystalline silicon pattern and the lower gate conductive layer.

In an embodiment, the lower gate insulating film may include silicon oxide, the buffer layer includes silicon oxide, and an oxygen content of the lower gate insulating film may be higher than an oxygen content of the buffer layer.

Aspects of the disclosure may provide a display device with improved interface characteristics at a lower portion of a channel region of an active layer, and a method of fabricating the same.

Aspects of the disclosure also provide a display device capable of easily varying the thickness of an active layer, and a method of fabricating the same.

It should be noted that aspects of the disclosure are not limited to the above-described aspects, and other aspects will be apparent to those skilled in the art from the following descriptions.

According to an aspect of the disclosure, there may be provided a display device including a substrate, and a thin-film transistor formed on the substrate, wherein the thin-film transistor includes a lower gate conductive layer disposed on the substrate, a lower gate insulating film disposed on the lower gate conductive layer, and an active layer disposed on an upper surface of the lower gate insulating film to completely cover the upper surface of the lower gate insulating film, wherein sidewalls of the lower gate insulating film and sidewalls of the active layer may be aligned with each other.

BRIEF DESCRIPTION OF THE DRAWINGS

The above and other aspects and features of the disclosure will become more apparent by describing embodiments thereof in detail with reference to the attached drawings, in which.

DETAILED DESCRIPTION OF THE EMBODIMENTS

Figure 1:
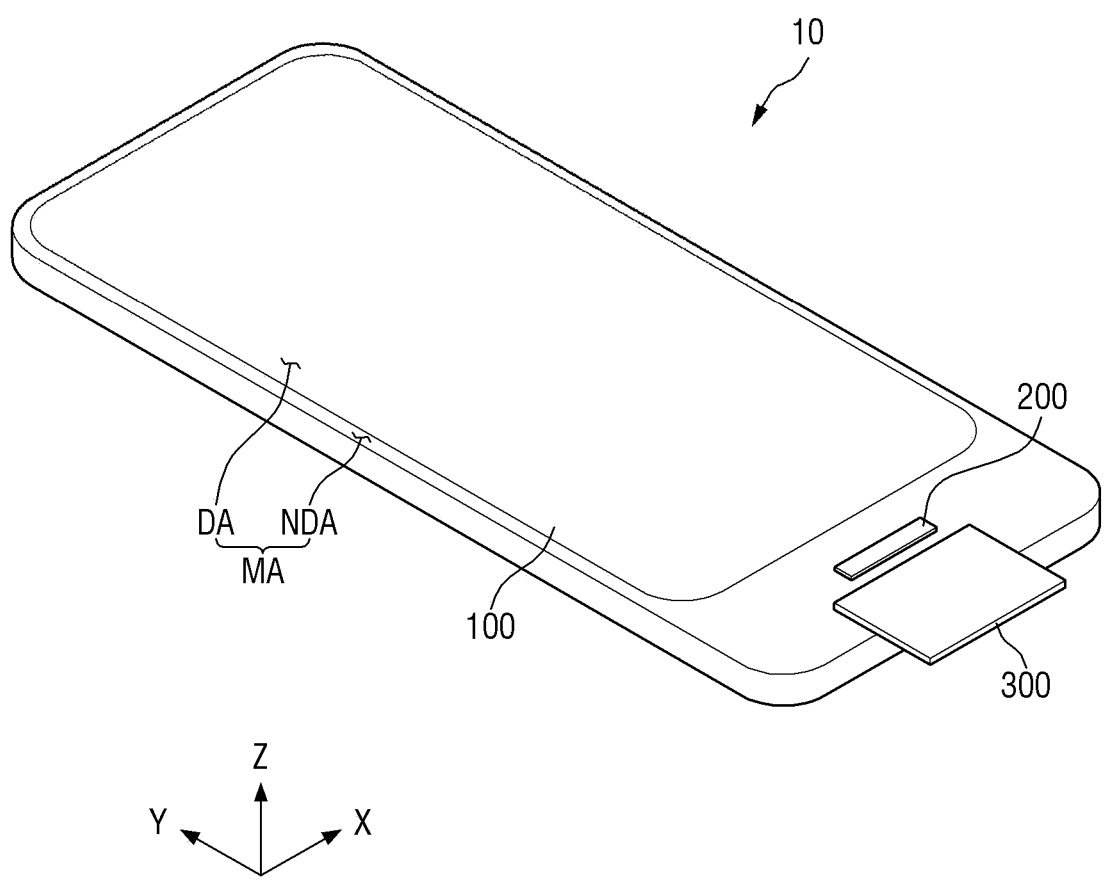
FIG. 1 is a schematic perspective view illustrating a display device according to an embodiment.

Embodiments will now be described more fully hereinafter with reference to the accompanying drawings. The invention may, however, be embodied in different forms and should not be construed as limited to the embodiments set forth herein. Rather, these embodiments are provided so that this disclosure will be thorough and complete. The same or similar parts are denoted by the same reference numerals throughout this specification. In the drawings, thicknesses, ratios, and dimensions of the components may be exaggerated for effective description.

As used herein, the singular forms "a," "an," and "the" are intended to include the plural forms as well, unless the context clearly indicates otherwise. The terms "and" and "or" may be used in the conjunctive or disjunctive sense and may be understood to be equivalent to "and/or."

Terms such as "first", "second", and the like may be used to describe various components, but these terms are not limiting. Rather, these terms are used only for the purpose of distinguishing one component from another component. For example, without departing from the scope of the invention, a first component may be referred to as a second component, and similarly, a second component may also be referred to as a first component.

Terms such as "under", "below", "on", and "above" are used to describe an association of configurations shown in the drawings. The terms are described based on a direction indicated in the drawings as relative concepts. Terms such as "overlap" and "cover" may include layer, stack, face, extend over, extend under, or any other suitable term as would be appreciated and understood by those of ordinary skill in the art, and may refer to a partial or full overlap or cover, as would be appreciated and understood by those of ordinary skill in the art.

It will also be understood that when a layer is referred to as being "on" or the like with respect to another layer or substrate, it can be directly on the other layer or substrate, or intervening layers may also be present. In contrast, when an element is referred to as being "directly on" another element, there may be no intervening elements present.

It should be understood that a term of "include", "have", or the like is used to specify that there is a feature, a number, a step, an operation, a component, a part, or a combination thereof described in the specification, but does not exclude a possibility of the presence or addition of one or more other features, numbers, steps, operations, components, parts, or combinations thereof.

The features of various embodiments of the disclosure can be partially or entirely bonded to or combined with each other and can be interlocked and operated in various ways technically, and the embodiments can be carried out independently of or in association with each other.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 5% of the stated value.

Unless otherwise defined, all terms used herein (including technical and scientific terms) have the same meaning as commonly understood by those skilled in the art to which this disclosure pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the specification.

Hereinafter, embodiments will be described with reference to the accompanying drawings.

Figure 2:
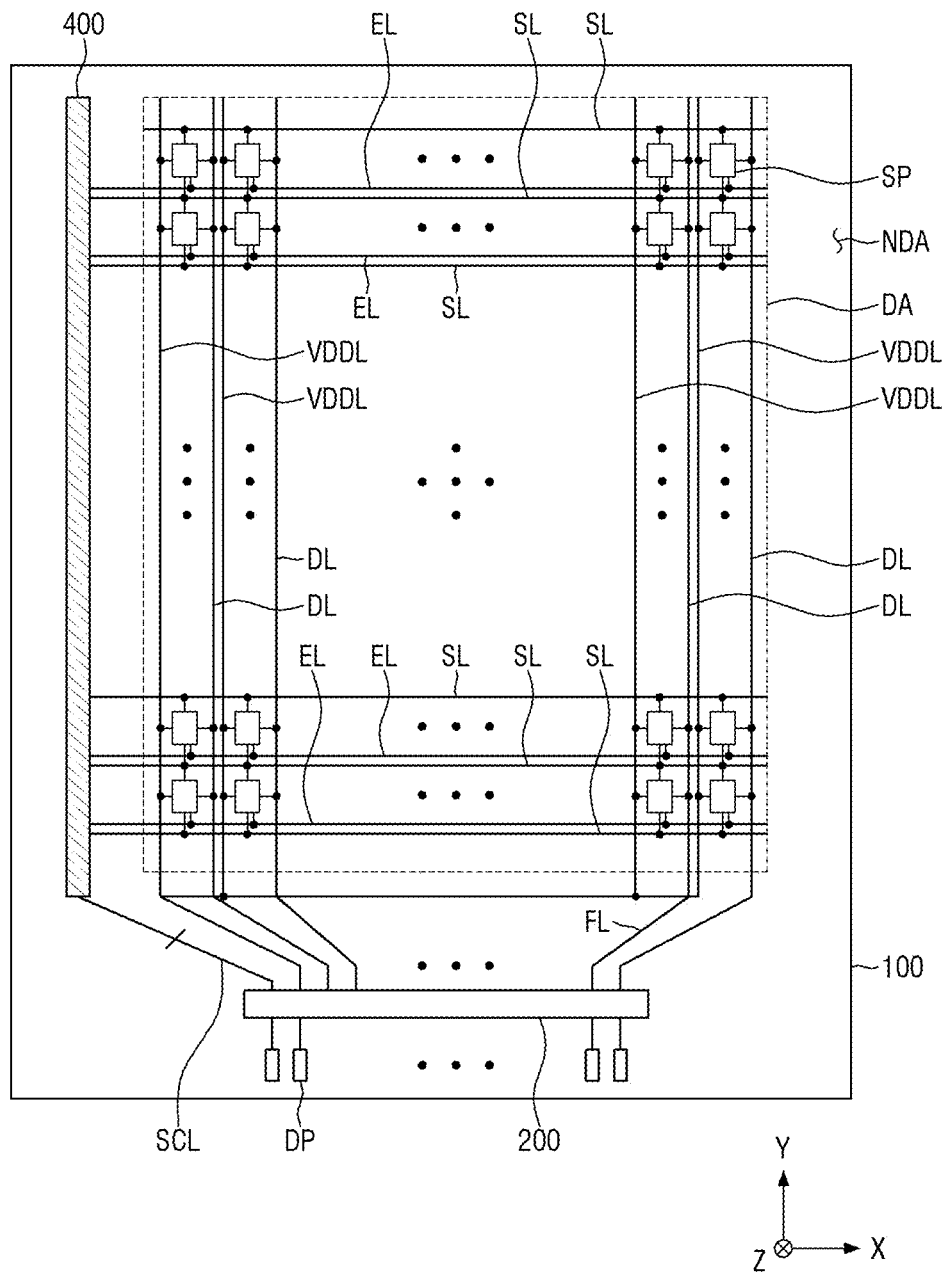
FIG. 2 is a schematic plan view illustrating the display device according to an embodiment.
Figure 3:
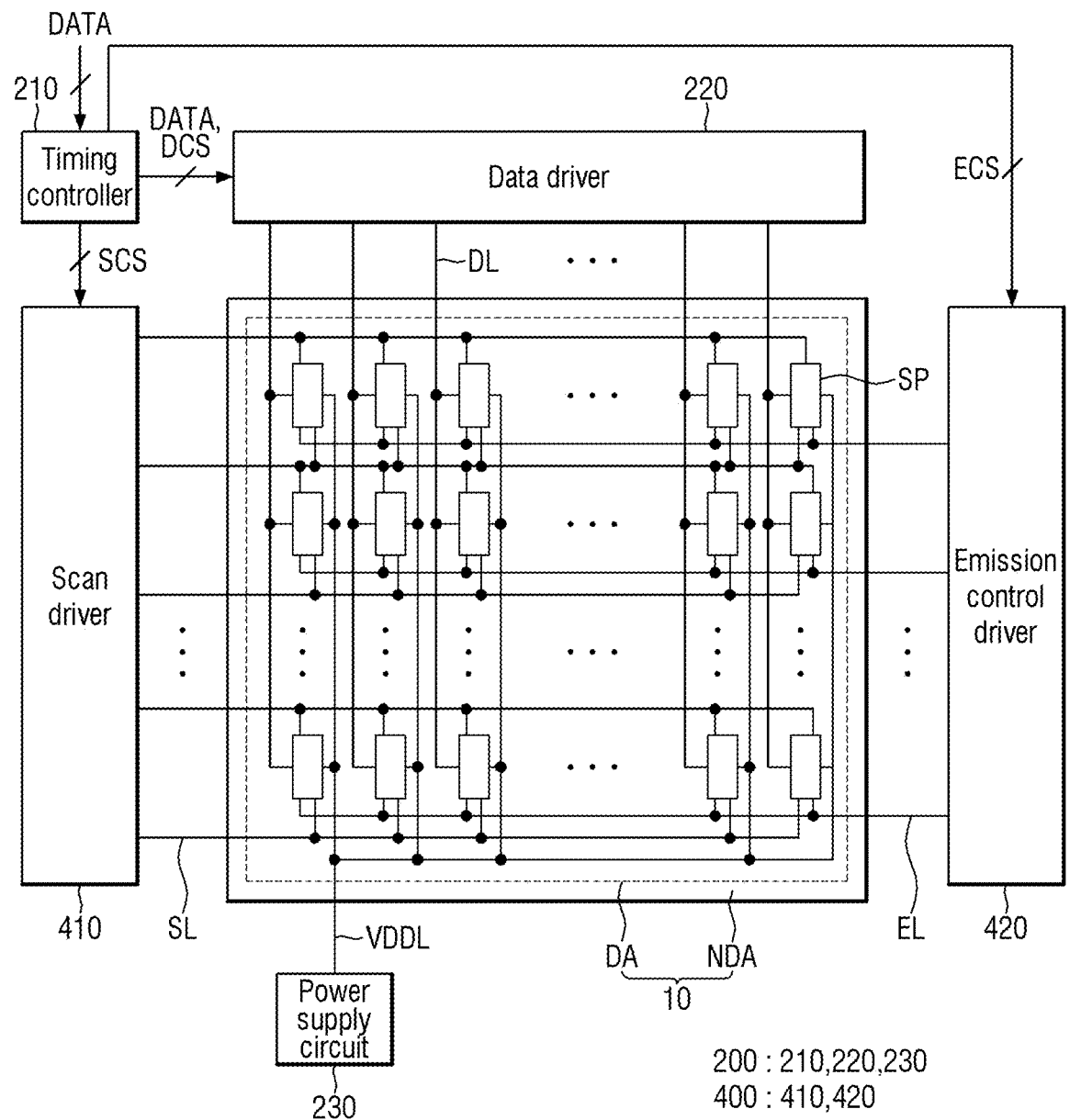
FIG. 3 is a schematic block diagram illustrating the display device according to an embodiment.

FIG. 1 is a schematic perspective view illustrating a display device according to an embodiment. FIG. 2 is a schematic plan view illustrating the display device according to an embodiment. FIG. 3 is a schematic block diagram illustrating the display device according to an embodiment.

In the drawings, a first direction X, a second direction Y, and a third direction Z may be defined. The first direction X and the second direction Y may be directions perpendicular to each other on a plane. The third direction Z may be a direction perpendicular to the first direction X and the second direction Y. The third direction Z may be perpendicular to each of the first direction X and the second direction Y. In the embodiments, the third direction Z may indicate a thickness direction of a display device 10.

Unless stated otherwise in the specification, an "upper portion," a "top," or an "upper side" may indicate a side in the third direction Z, for example, a display direction, and an "upper surface" may indicate a surface facing a side in the third direction Z. Likewise, a "lower portion," a "bottom," or a "lower side" may indicate the other side in the third direction Z, for example, an opposite direction of the display direction, and a "lower surface" may indicate a surface facing the other side in the third direction Z. Further, the terms "left," "right," "upper," and "lower" may refer to directions when the display device 10 may be viewed from above. For example, "left" may indicate the opposite direction of the first direction X, "right" may indicate the first direction X, "upper" may indicate the second direction Y, and "lower" may indicate the opposite direction of the second direction Y.

Referring to FIGS. 1 and 3, a display device 10 may be a device which displays a video or a still image and may be used as a display screen of various products such as a television, a laptop computer, a monitor, a digital signage, and a device for Internet of Things (IoT) in addition to portable electronic devices such as a mobile phone, a smartphone, a tablet personal computer (PC), a smart watch, a watch phone, a mobile communication terminal, an electronic notebook, an electronic book, a portable multimedia player (PMP), a navigation device, and an ultra-mobile PC (UMPC).

The display device 10 may be an organic light-emitting display device, a liquid crystal display device, a plasma display device, a field emission display device, an electrophoretic display device, an electro-wetting display device, a quantum dot light-emitting display device, and a micro light-emitting diode (LED) display device. Hereinafter, it will be described that the display device 10 may be the organic light-emitting display device, but the disclosure is not limited thereto.

The display device 10 may include a display panel 100, a display driving circuit 200, and a circuit board 300.

The display panel 100 may be formed as, but is not limited to, a flat surface having a rectangular shape having a short side in the first direction X and a long side in the second direction Y intersecting the first direction X. A corner at which the short side in the first direction X meets the long side in the second direction Y may be rounded to have a certain curvature or formed at a right angle. The planar shape of the display panel 100 is not limited to the rectangular shape and may be formed in a polygonal shape, a circular shape, or an elliptical shape which may be different from the rectangular shape. The display panel 100 may be formed to be flat, but is not limited thereto, and may include curved surface portions that may be formed at left and right ends thereof and have a constant curvature or a varied curvature. The display panel 100 may be formed to be flexible so as to be bendable, foldable, or rollable.

The display panel 100 may include a display area DA in which subpixels SP may be formed to display images and a non-display area NDA that may be a peripheral area of the display area DA. In case that the display panel 100 includes the curved surface portions, the display area DA may also be disposed in the curved surface portions. Images of the display panel 100 may also be visible in the curved surface portion.

In the display area DA, scan lines SL, emission lines EL, data lines DL, and first driving voltage lines VDDL that may be electrically connected to the subpixels SP may be disposed in addition to the subpixels SP. The scan lines SL and the emission lines EL may be formed to be parallel in the first direction X, and the data lines DL and the first driving voltage lines VDDL may be formed to be parallel in the second direction Y. The first driving voltage lines VDDL may be formed to be parallel in the second direction Y in the display area DA and may be electrically connected to each other in the non-display area NDA.

Each of the subpixels SP may be electrically connected to at least one of the scan lines SL, one of the data lines DL, at least one of the emission lines EL, and the first driving voltage line VDDL. It is illustrated in FIG. 2 that each of the subpixels SP may be electrically connected to two scan lines SL, one data line DL, one emission line EL, and the first driving voltage line VDDL, but the disclosure is not limited thereto. For example, each of the subpixels SP may also be electrically connected to three scan lines SL instead of two scan lines SL.

Each of the subpixels SP may include a driving transistor, at least one transistor, a light-emitting element, and a capacitor. The transistor may be turned on in case that a scan signal is applied through the scan line SL, and accordingly, a data voltage through the data line DL may be applied to a gate electrode of the driving transistor. The driving transistor may supply a driving current to the light-emitting element according to the data voltage applied to the gate electrode thereof so that the light-emitting element may emit light. The driving transistor and the at least one transistor may be thin-film transistors. The light-emitting element may emit light according to the driving current of the driving transistor. The light-emitting element may be an organic light-emitting diode including a pixel electrode, an organic light-emitting layer, and a common electrode. The capacitor may serve to maintain (e.g., constantly maintain) the data voltage applied to the gate electrode of the driving transistor.

The non-display area NDA may be defined as a region from an outer side of the display area DA to an edge of the display panel 100. A scan driving circuit 400, fan-out lines FL, pads DP, and scan control lines SCL may be disposed in the non-display area NDA.

Specifically, the scan driving circuit 400 for applying scan signals to the scan lines SL, the fan-out lines FL between the display driving circuit 200 disposed in the non-display area NDA and the data lines DL, the pads DP electrically connected to the display driving circuit 200, and the scan control lines SCL connecting the scan driving circuit 400 to the display driving circuit 200 may be disposed in the non-display area NDA. The display driving circuit 200 and the pads DP may be disposed at a side edge of the display panel 100. The pads DP may be disposed to be closer to the side edge of the display panel 100 than the display driving circuit 200.

Referring to FIGS. 2 and 3, the scan driving circuit 400 may include a scan driver 410 and an emission control driver 420. The scan driving circuit 400 may receive scan control signals SCS and emission control signals ECS from the display driving circuit 200 through the scan control lines SCL.

The scan driver 410 may generate the scan signals according to the scan control signals SCS received from the display driving circuit 200 and sequentially output the scan signals to the scan lines SL. The emission control driver 420 may generate light emission control signals according to the emission control signals ECS received from the display driving circuit 200, and sequentially output the light emission control signals to the emission lines EL.

The scan driving circuit 400 may include thin-film transistors. The scan driving circuit 400 may be formed to be coplanar with the thin-film transistors of the subpixels SP. The scan driving circuit 400 is illustrated in FIG. 2 as being formed in the non-display area NDA at a side of the display area DA, for example, at a left side of the display area DA, but the disclosure is not limited thereto. For example, the scan driving circuit 400 may be formed in the non-display areas NDA at both sides of the display area DA, for example, on the non-display areas NDA at the left and right sides of the display area DA.

The display driving circuit 200 may include a timing controller 210, a data driver 220, and a power supply circuit 230.

The timing controller 210 may receive digital video data and timing signals from the circuit board 300. The timing controller 210 may generate the scan control signals SCS, the emission control signals ECS, and data control signals DCS according to the timing signals.

Specifically, the timing controller 210 may generate the scan control signals SCS for controlling operation timings of the scan driver 410, the emission control signal ECS for controlling operation timings of the emission control driver 420, and the data control signals DCS for controlling operation timings of the data driver 220. The timing controller 210 may output the scan control signals SCS to the scan driver 410 through the scan control lines SCL and output the emission control signals ECS to the emission control driver 420. The timing controller 210 may output the digital video data and the data control signals DCS to the data driver 220.

The data driver 220 may convert the digital video data into analog positive/negative data voltages and output the converted analog positive/negative data voltages to the data lines DL through the fan-out lines FL. In case that the subpixels SP are selected according to the scan signals of the scan driving circuit 400, the data voltages may be supplied to the selected subpixels SP.

The power supply circuit 230 may generate a first driving voltage and supply the first driving voltage to the first driving voltage line VDDL. The power supply circuit 230 may generate a second driving voltage and supply the second driving voltage to a cathode of the organic light-emitting diode of each of the subpixels SP. The first driving voltage may be a high potential voltage for driving the organic light-emitting diode and the second driving voltage may be a low potential voltage for driving the organic light-emitting diode. For example, the first driving voltage may have a higher potential than the second driving voltage.

The display driving circuit 200 may be formed as an integrated circuit (IC) and attached onto the display panel 100 through a chip on glass (COG) method, a chip on plastic (COP) method, or an ultrasonic bonding method, but the disclosure is not limited thereto. For example, the display driving circuit 200 may be attached onto the circuit board 300.

The circuit board 300 may be attached onto the pads DP using an anisotropic conductive film. Accordingly, lead lines of the circuit board 300 may be electrically connected to the pads DP. The circuit board 300 may be a flexible printed circuit board, a printed circuit board, or a flexible film such as a chip on film.

Figure 4:
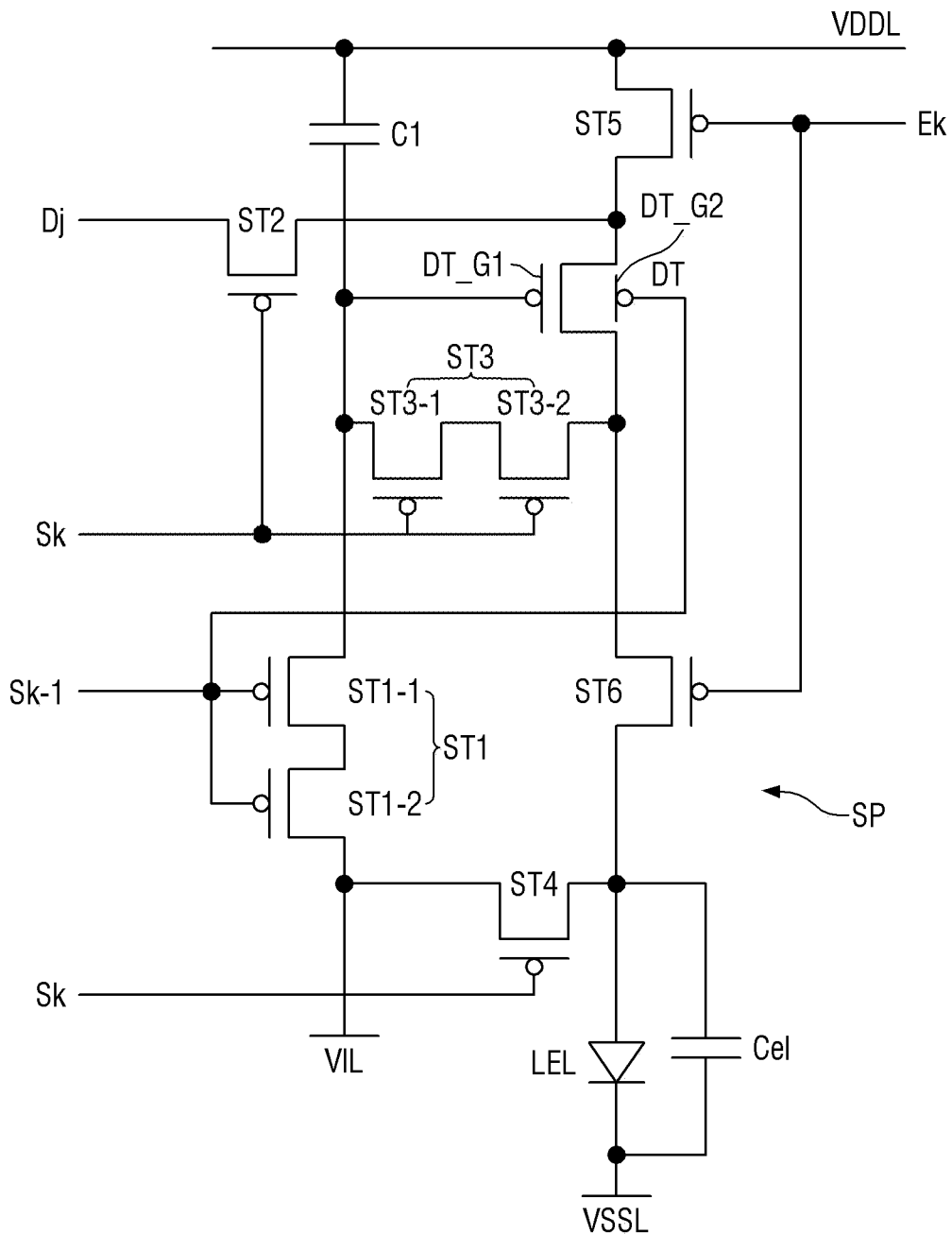
FIG. 4 is a schematic circuit diagram illustrating a sub-pixel according to an embodiment.

FIG. 4 is a schematic circuit diagram illustrating a subpixel according to an embodiment.

Referring to FIG. 4, the subpixel SP may be electrically connected to a (k-1)-th (k may be a positive integer greater than or equal to 2) scan line Sk−1, a k-th scan line Sk, and a j-th (j may be a positive integer) data line Dj. The subpixel SP may be electrically connected to the first driving voltage line VDDL through which the first driving voltage may be supplied, an initialization voltage line VIL through which an initialization voltage may be supplied, and a second driving voltage line VSSL through which the second driving voltage may be supplied.

The subpixel SP may include a driving transistor DT, a light-emitting element LEL, switch elements, and a capacitor C1. The switch elements may include first to sixth transistors ST1, ST2, ST3, ST4, ST5, and ST6.

The driving transistor DT may include a first gate electrode DT_G1, a second gate electrode DT_G2, a first electrode, and a second electrode. The first gate electrode DT_G1 may be an upper gate electrode disposed above an active layer of the driving transistor DT, and the second gate electrode DT_G2 may be a lower gate electrode disposed below the active layer of the driving transistor DT.

The second gate electrode DT_G2 of the driving transistor DT may be electrically connected to the (k−1)-th scan line Sk−1. The driving transistor DT may control a drain-source current (hereinafter, referred to as a driving current) according to the data voltage applied to the first gate electrode DT_G1. The driving current flowing through a channel of the driving transistor DT may be proportional to the square of a difference between a voltage between the first gate electrode DT_G1 and a source electrode of the driving transistor DT, and a threshold voltage of the driving transistor DT.

The light-emitting element LEL may emit light according to the driving current. An amount of emitted light of the light-emitting element LEL may be proportional to the driving current.

The light-emitting element LEL may be an organic light-emitting diode including a first electrode, a second electrode, and an organic light-emitting layer disposed between the first electrode and the second electrode. As another example, the light-emitting element LEL may be an inorganic light-emitting element including a first electrode, a second electrode, and an inorganic semiconductor disposed between the first electrode and the second electrode. As another example, the light-emitting element LEL may be a quantum dot light-emitting element including a first electrode, a second electrode, and a quantum dot light-emitting layer disposed between the first electrode and the second electrode. As another example, the light-emitting element LEL may be a micro-LED. The first electrode of the light-emitting element LEL may be a pixel electrode, and the second electrode thereof may be a common electrode.

An anode of the light-emitting element LEL may be electrically connected to a first electrode of the fourth transistor ST4 and a second electrode of the sixth transistor ST6, and a cathode thereof may be electrically connected to the second driving voltage line VSSL. A parasitic capacitance Cel may be formed between the anode and the cathode of the light-emitting element LEL.

The first transistor ST1 may be formed as a dual transistor including a first-1 transistor ST1-1 and a first-2 transistor ST1-2. The first-1 transistor ST1-1 and the first-2 transistor ST1-2 may be turned on in response to a scan signal of the (k−1)-th scan line Sk−1 to connect the gate electrode of the driving transistor DT to the initialization voltage line VIL. The gate electrode of the driving transistor DT may be discharged to have the initialization voltage of the initialization voltage line VIL. A gate electrode of the first-1 transistor ST1-1 may be electrically connected to the (k−1)-th scan line Sk−1, and a first electrode of the first-1 transistor ST1-1 may be electrically connected to the driving transistor DT, and a second electrode of the first-1 transistor ST1-1 may be electrically connected to a first electrode of the first-2 transistor ST1-2. A gate electrode of the first-2 transistor ST1-2 may be electrically connected to the (k−1)-th scan line Sk−1, the first electrode of the first-2 transistor ST1-2 may be electrically connected to the second electrode of the first-1 transistor ST1-1, and a second electrode of the first-2 transistor ST1-2 may be electrically connected to the initialization voltage line VIL.

The second transistor ST2 may be turned on in response to a scan signal of the k-th scan line Sk to connect the first electrode of the driving transistor DT to the j-th data line Dj. A gate electrode of the second transistor ST2 may be electrically connected to the k-th scan line Sk, a first electrode of the second transistor ST2 may be electrically connected to the first electrode of the driving transistor DT, and a second electrode of the second transistor ST2 may be electrically connected to the data line Dj.

The third transistor ST3 may be formed as a dual transistor including a third-first transistor ST3-1 and a third-second transistor ST3-2. The third-first transistor ST3-1 and the third-second transistor ST3-2 may be turned on in response to the scan signal of the k-th scan line Sk to connect the gate electrode of the driving transistor DT to the second electrode of the driving transistor DT. For example, in case that the third-first transistor ST3-1 and the third-second transistor ST3-2 are turned on, the gate electrode of the driving transistor DT may be electrically connected to the second electrode of the driving transistor DT so that the driving transistor DT may be operated as a diode. A gate electrode of the third-first transistor ST3-1 may be electrically connected to the k-th scan line Sk, a first electrode of the third-first transistor ST3-1 may be a second electrode of the third-second transistor ST3-2, and a second electrode of the third-first transistor ST3-1 may be electrically connected to the gate electrode of the driving transistor DT. A gate electrode of the third-second transistor ST3-2 may be electrically connected to the k-th scan line Sk, a first electrode of the third-second transistor ST3-2 may be electrically connected to the second electrode of the driving transistor DT, and the second electrode of the third-second transistor ST3-2 may be electrically connected to the first electrode of the third-first transistor ST3-1.

The fourth transistor ST4 may be turned on in response to the scan signal of the k-th scan line Sk to connect the anode of the light-emitting element LEL to the initialization voltage line VIL. The anode of the light-emitting element LEL may be discharged to have the initialization voltage. A gate electrode of the fourth transistor ST4 may be electrically connected to the k-th scan line Sk, the first electrode of the fourth transistor ST4 may be electrically connected to the anode of the light-emitting element LEL, and a second electrode of the fourth transistor ST4 may be electrically connected to the initialization voltage line VIL.

The fifth transistor ST5 may be turned on in response to an emission control signal of a k-th emission line Ek to connect the first electrode of the driving transistor DT to the first driving voltage line VDDL. A gate electrode of the fifth transistor ST5 may be electrically connected to the k-th emission line Ek, a first electrode of the fifth transistor ST5 may be electrically connected to the first driving voltage line VDDL, and a second electrode of the fifth transistor ST5 may be electrically connected to the first electrode of the driving transistor DT.

The sixth transistor ST6 may be formed between the second electrode of the driving transistor DT and the anode of the light-emitting element LEL. The sixth transistor ST6 may be turned on in response to the emission control signal of the k-th emission line Ek to connect the second electrode of the driving transistor DT to the anode of the light-emitting element LEL. A gate electrode of the sixth transistor ST6 may be electrically connected to the k-th emission line Ek, a first electrode of the sixth transistor ST6 may be electrically connected to the second electrode of the driving transistor DT, and the second electrode of the sixth transistor ST6 may be electrically connected to the anode of the light-emitting element LEL. In case that both the fifth transistor ST5 and the sixth transistor ST6 are turned on in response to the emission control signal of the k-th emission line Ek, the driving current may be supplied to the light-emitting element LEL.

The capacitor C1 may be formed between the first gate electrode DT_G1 of the driving transistor DT and the first driving voltage line VDDL. An electrode of the capacitor C1 may be electrically connected to the first gate electrode DT_G1 of the driving transistor DT, and the other electrode thereof may be electrically connected to the first driving voltage line VDDL.

In each of the first to sixth transistors ST1, ST2, ST3, ST4, ST5, and ST6 and the driving transistor DT, in case that the first electrode is a source electrode, the second electrode may be a drain electrode. As another example, in each of the first to sixth transistors ST1, ST2, ST3, ST4, ST5, and ST6 and the driving transistor DT, in case that the first electrode is a drain electrode, the second electrode may be a source electrode.

An active layer of each of the first to sixth transistors ST1, ST2, ST3, ST4, ST5, and ST6 and the driving transistor DT may be formed of one among polysilicon, amorphous silicon, and an oxide semiconductor, or a combination thereof. In a case in which a semiconductor layer of each of the first to sixth transistors ST1, ST2, ST3, ST4, ST5, and ST6 and the driving transistor DT is formed of polysilicon, a process for forming the semiconductor layer may be a low-temperature polysilicon (LTPS) process. Hereinafter, descriptions will be given focusing on the case in which the active layer of the driving transistor DT may be formed of polysilicon (poly silicon or crystalline silicon), but the disclosure is not limited thereto.

In FIG. 4, the first to sixth transistors ST1, ST2, ST3, ST4, ST5, and ST6 and the driving transistor DT are illustrated as being formed of p-type metal-oxide-semiconductor (PMOS) transistors, but are not limited thereto, and may be formed of n-type metal-oxide-semiconductor (NMOS) transistors.

Figure 5:
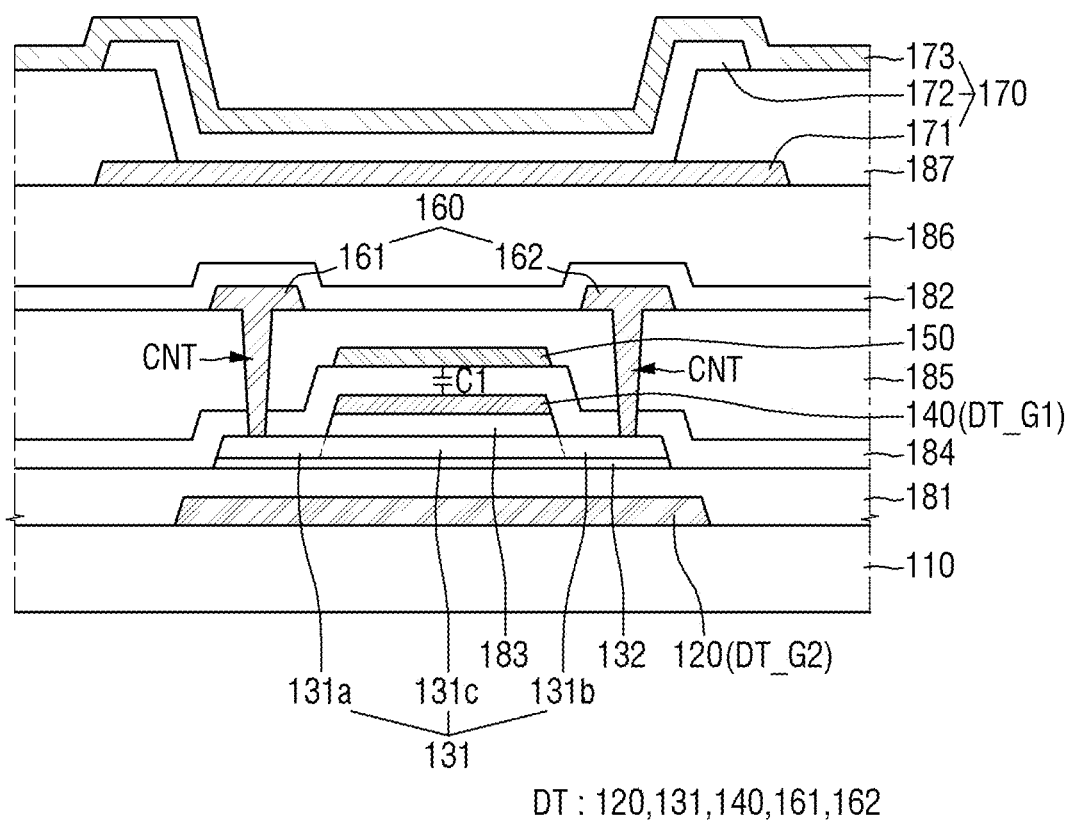
FIG. 5 is a schematic cross-sectional view of a display panel of the display device according to an embodiment.

FIG. 5 is a schematic cross-sectional view of a display panel of the display device according to an embodiment. An example of the driving transistor DT and the capacitor C1 of a subpixel SP is illustrated in FIG. 5.

Referring to FIG. 5, the display panel 100 may include a substrate 110, an active layer 131 disposed on the substrate 110, conductive layers, and insulating layers. The active layer 131 may include crystalline silicon (polysilicon). The conductive layers may include a lower gate conductive layer 120, an upper gate conductive layer 140, a first conductive layer 150, a second conductive layer 160, a pixel electrode 171, and a common electrode 173. The insulating layers may include a buffer layer 181, a lower gate insulating film 132, an upper gate insulating film 183, a first interlayer insulating film 184, a second interlayer insulating film 185, a passivation layer 182, a via layer 186, and a pixel definition film 187.

The substrate 110 may be an insulating substrate. The substrate 110 may include a transparent material. For example, the substrate 110 may include a transparent insulating material such as glass, quartz, or a polymer resin, or a combination thereof. The substrate 110 may be a flexible substrate that may be bendable, foldable, and rollable or a rigid substrate. However, the substrate 110 is not limited to those illustrated above and may include plastic such as polyimide. The substrate 110 may have flexible characteristics such as bendable, foldable, and rollable characteristics.

The lower gate conductive layer 120 may be disposed on the substrate 110. The lower gate conductive layer 120 may have a patterned shape. The lower gate conductive layer 120 may include the second gate electrode DT_G2 of the driving transistor DT.

The lower gate conductive layer 120 may be disposed below the active layer 131 to cover at least a channel region 131c of the active layer 131, and furthermore, may be disposed to cover the entire active layer 131. The lower gate conductive layer 120 may be a light-blocking layer that serves to protect the active layer 131 from external light. Therefore, the lower gate conductive layer 120 may prevent leakage current due to light from flowing into the channel region 131c of the active layer 131. The lower gate conductive layer 120 may be formed as a single layer or a multi-layer that may be made of one selected from among molybdenum (Mo), aluminum (Al), chromium (Cr), gold (Au), titanium (Ti), nickel (Ni), neodymium (Nd), and copper (Cu) or an alloy thereof.

The buffer layer 181 may be disposed on the lower gate conductive layer 120. The buffer layer 181 may be disposed to cover the surface (e.g., entire surface) of the substrate 110 on which the lower gate conductive layer 120 may be formed. The buffer layer 181 may be formed on the substrate 110. The buffer layer 181 may serve to protect the thin-film transistors and the light-emitting layer from moisture penetrating through the substrate 110 which may be vulnerable to moisture permeation. The buffer layer 181 may include silicon nitride, silicon oxide, silicon oxynitride, or the like, or a combination thereof. For example, the buffer layer 181 may be formed as a multi-film in which one or more inorganic films among a silicon oxide film, a silicon nitride film, and a silicon oxynitride layer may be alternately stacked on each other. In an embodiment, the buffer layer 181 may include triple films of SiOx/SiNx/SiOx.

The lower gate insulating film 132 may be disposed to expose at least a portion of the substrate 110. The lower gate insulating film 132 may be disposed on the buffer layer 181. The lower gate insulating film 132 may be disposed on the buffer layer 181 to overlap at least a portion of the lower gate conductive layer 120. The lower gate insulating film 132 may be formed by dividing a patterned silicon layer into the lower gate insulating film 132 and the active layer 131, which will be described below. Accordingly, the lower gate insulating film 132 may be formed in a same pattern as the active layer 131. Sidewalls of the lower gate insulating film 132 and sidewalls of the active layer 131 may be aligned to be parallel with each other. The lower gate insulating film 132 may include silicon oxide, silicon nitride, or silicon oxynitride, or a combination thereof.

In an embodiment, the lower gate insulating film 132 may be formed of a SiOx film. In case that the buffer layer 181 is formed as a triple film of SiOx/SiNx/SiOx, and the lower gate insulating film 132 is made of SiOx, the SiOx film of the lower gate insulating film 132 may be formed to be denser than the SiOx film of the uppermost layer of the buffer layer 181. Here, the phrase, "the SiOx film may be formed to be denser," may mean that the number of bonds of silicon atoms and oxygen atoms may be higher. The oxygen concentration of the lower gate insulating film 132 may be higher than that of the uppermost film of the buffer layer 181.

The active layer 131 may be disposed on the lower gate insulating film 132. The active layer 131 may be disposed on an upper surface of the lower gate insulating film 132. The active layer 131 may be formed to cover the entire upper surface of the lower gate insulating film 132. For example, a lower surface of the active layer 131 and the upper surface of the lower gate insulating film 132 may be a same plane surface. As described above, the sidewalls of the active layer 131 and the lower gate insulating film 132 may be aligned with each other.

The active layer 131 may include a first doped region 131a, a second doped region 131b, and the channel region 131c. The channel region 131c may be disposed between the first doped region 131a and the second doped region 131b. In an embodiment, the active layer 131 may be made of crystalline silicon.

The upper gate insulating film 183 may be disposed on the active layer 131. In an embodiment, the upper gate insulating film 183 may be formed in a same pattern as the upper gate conductive layer 140 to be described below. Sidewalls of the upper gate insulating film 183 and sidewalls of the upper gate conductive layer 140 may be aligned (e.g. substantially aligned) with each other, but the disclosure is not limited thereto. The upper gate insulating film 183 may include a silicon compound, a metal oxide, or the like, or a combination thereof. For example, the upper gate insulating film 183 may include a silicon oxide, a silicon nitride, a silicon oxynitride, an aluminum oxide, a tantalum oxide, a hafnium oxide, a zirconium oxide, a titanium oxide, and the like, or a combination thereof.

The upper gate conductive layer 140 may be disposed on the upper gate insulating film 183. The upper gate conductive layer 140 may have a patterned shape. The first gate electrode DT_G1 of the driving transistor DT and an electrode of the capacitor C1 may be formed of the upper gate conductive layer 140. The upper gate conductive layer 140 may overlap the active layer 131 with the upper gate insulating film 183 therebetween. Specifically, the upper gate conductive layer 140 may overlap the channel region 131c of the active layer 131. The upper gate conductive layer 140 may be formed as a single layer or a multi-layer that may be made of one selected from among Mo, Al, Cr, Au, Ti, Ni, Nd, and Cu or an alloy thereof.

The first interlayer insulating film 184 may be disposed on the upper gate conductive layer 140. The first interlayer insulating film 184 may include an inorganic insulating material such as silicon oxide, silicon nitride, silicon oxynitride, hafnium oxide, aluminum oxide, titanium oxide, tantalum oxide, or zinc oxide, or a combination thereof.

The first conductive layer 150 may be disposed on the first interlayer insulating film 184. The first driving voltage line and the other electrode of the capacitor C1 may be formed of the first conductive layer 150. The first conductive layer 150 may overlap the upper gate conductive layer 140 with the first interlayer insulating film 184 therebetween. The first conductive layer 150 may be formed as a single layer or a multi-layer that may be made of one selected from among Mo, Al, Cr, Au, Ti, Ni, Nd, and Cu or an alloy thereof.

The second interlayer insulating film 185 may be disposed on the first conductive layer 150. The second interlayer insulating film 185 may be disposed on the first conductive layer 150 and a portion of the first interlayer insulating film 184 exposed by the first conductive layer 150. The second interlayer insulating film 185 may include an inorganic insulating material such as silicon oxide, silicon nitride, silicon oxynitride, hafnium oxide, aluminum oxide, titanium oxide, tantalum oxide, or zinc oxide, or a combination thereof.

The second conductive layer 160 may be disposed on the second interlayer insulating film 185. A first electrode 161 (or a first source/drain electrode) of the driving transistor DT and a second electrode 162 (or a second source/drain electrode) of the driving transistor DT may be formed of the second conductive layer 160. The first electrode 161 of the driving transistor DT and the second electrode 162 of the driving transistor DT may be electrically connected to the active layer 131 through contact holes CNT passing through the first interlayer insulating film 184 and the second interlayer insulating film 185.

Specifically, the first electrode 161 of the driving transistor DT may be electrically connected to the first doped region 131a of the active layer 131 through the contact hole CNT exposing the first doped region 131a of the active layer 131 by passing through the first and second interlayer insulating films 184 and 185. The second electrode 162 of the driving transistor DT may be electrically connected to the second doped region 131b of the active layer 131 through the contact hole CNT exposing the second doped region 131b of the active layer 131 by passing through the first and second interlayer insulating films 184 and 185. A region in which the first electrode 161 of the driving transistor DT may be electrically connected to the first doped region 131a of the active layer 131 and a region in which the second electrode 162 of the driving transistor DT may be electrically connected to the second doped region 131b of the active layer 131 may overlap the lower gate insulating film 132.

The passivation layer 182 may be disposed on the second conductive layer 160. The passivation layer 182 may serve to cover and protect the second conductive layer 160. The passivation layer 182 may include an inorganic insulating material such as silicon oxide, silicon nitride, silicon oxynitride, hafnium oxide, aluminum oxide, titanium oxide, tantalum oxide, or zinc oxide, or a combination thereof.

The via layer 186 may be disposed on the passivation layer 182. The via layer 186 may serve to planarize the height difference due to the transistor of the passivation layer 182. The via layer 186 may include an organic insulating material such as an acrylic resin (polyacrylate-based resin), an epoxy resin, phenolic resin, a polyamide-based resin, a polyimide-based resin, an unsaturated polyester-based resin, a poly phenylenether-based resin, a polyphenylene sulfide-based resin, or benzo cyclobutene (BCB), or a combination thereof. The via layer 186 may further include a photosensitive material, but the disclosure is not limited thereto. In an embodiment, the via layer 186 may be made of polyimide.

In FIG. 5, the driving transistor DT is illustrated as being formed using a double gate method in which the gate electrode of the driving transistor DT may be positioned both above and below the active layer, but the disclosure is not limited thereto. For example, the driving transistor DT may be formed using a bottom gate method in which a gate electrode of the transistor may be positioned below the active layer or a top gate method in which a gate electrode may be positioned above the active layer.

A light-emitting element layer 170 and the pixel definition film 187 may be disposed on the via layer 186.

The light-emitting element layer 170 may include the pixel electrode 171, a light-emitting layer 172, and the common electrode 173.

The pixel electrode 171 of the light-emitting element layer 170 may be disposed on the via layer 186. Although not illustrated in FIG. 5, contact holes, which may expose the first electrode of the fourth transistor ST4 by passing through the via layer 186, may be formed in the via layer 186. The pixel electrode 171 of the light-emitting element layer 170 may be electrically connected to the first electrode of the fourth transistor ST4 through the contact holes.

The pixel electrode 171 may have a stacked film structure formed by stacking a material layer having a high work function and a reflective material layer, wherein the material layer may be made of at least one selected from among indium tin oxide (ITO), indium zinc oxide (IZO), zinc oxide (ZnO), and indium oxide (In2O3), and the reflective material layer may be made of one selected from among silver (Ag), magnesium (Mg), Al, platinum (Pt), lead (Pd), Au, Ni, Nd, iridium (Ir), Cr, Li, Ca, and mixtures thereof. The material layer having a high work function may be disposed above the reflective material layer to be close to the light-emitting layer 172. The pixel electrode 171 may have a multilayer structure of ITO/Mg, ITO/MgF, ITO/Ag, and ITO/Ag/ITO, but the disclosure is not limited thereto.

The pixel definition film 187 may be formed to partition the pixel electrode 171 on the via layer 186 to perform a function of defining a light-emitting region of each of the subpixels SP. To this end, the pixel definition film 187 may be formed to cover an edge of the pixel electrode 171. Each of the subpixels SP may indicate a region in which the pixel electrode 171, the light-emitting layer 172, and the common electrode 173 may be sequentially stacked on each other and holes from the pixel electrode 171 and electrons from the common electrode 173 may be combined with each other in the light-emitting layer 172 to emit light. The pixel definition film 187 may be formed of an organic film made of an acrylic resin, an epoxy resin, a phenolic resin, a polyamide resin, a polyimide resin, or the like, or a combination thereof.

The light-emitting layer 172 may be formed on the pixel electrode 171 and the pixel definition film 187. The light-emitting layer 172 may include an organic material to emit a certain color. For example, the light-emitting layer 172 may include a hole transporting layer, an organic material layer, and an electron transporting layer.

The common electrode 173 may be formed on the light-emitting layer 172. The common electrode 173 may be formed to cover the light-emitting layer 172. The common electrode 173 may be a common layer commonly formed in the subpixels SP. A capping layer may be formed on the common electrode 173.

In a top emission structure, the common electrode 173 may be made of a transparent conductive material (TCO) capable of transmitting light, such as ITO or IZO or may be made of a semi-transmissive conductive material such as Mg, Ag, or an alloy of Mg and Ag. In case that the common electrode 173 is made of the semi-transmissive conductive material, light emission efficiency may be improved due to a microcavity.

Hereinafter, a method of fabricating the display device of FIG. 5 will be described.

FIGS. 6 to 14 are schematic cross-sectional views illustrating process operations of a method of fabricating the display device of FIG. 5.

Figure 6:
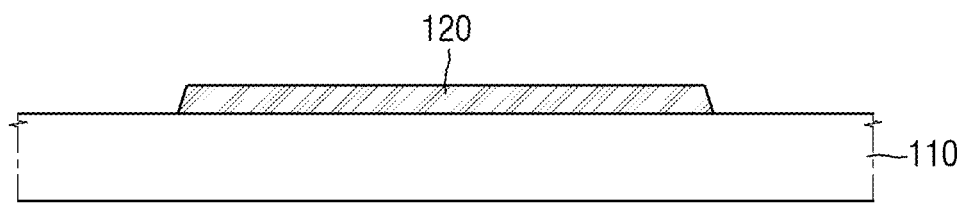
FIGS. 6 to 14 are schematic cross-sectional views illustrating process operations of a method of fabricating the display device of FIG. 5.

Referring to FIG. 6, a lower gate conductive layer 120 (e.g., a patterned lower gate conductive layer) may be formed on a substrate 110. The patterned lower gate conductive layer 120 may be formed by a mask process. For example, a material layer for a lower gate conductive layer may be entirely deposited on the substrate 110 and may be patterned through a photolithography process to form the lower gate conductive layer 120 as illustrated in FIG. 6.

Figure 7:
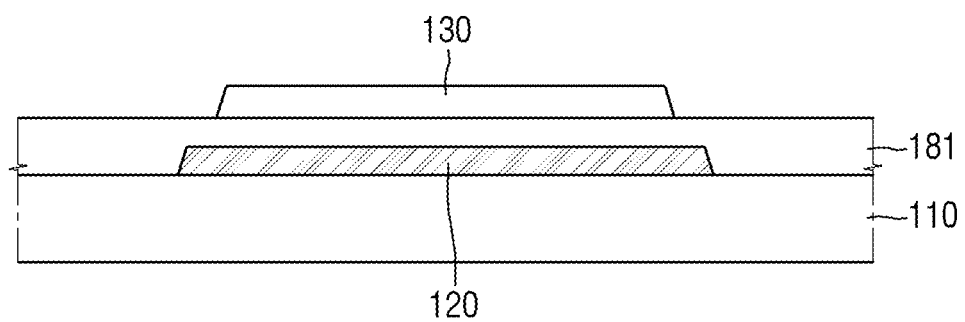

Referring to FIG. 7, a buffer layer 181 may be formed on the surface (e.g., the entire surface) of the substrate 110 on which the lower gate conductive layer 120 may be formed, and, an active material layer pattern 130 may be formed on the buffer layer 181.

Specifically, the buffer layer 181 may be formed on the surface (e.g., entire surface) of the substrate 110 on which the lower gate conductive layer 120 may be formed using a chemical vapor deposition (CVD) method or a plasma-enhanced chemical vapor deposition (PECVD) method. An active material layer may be deposited on the surface (e.g., entire surface) of the buffer layer 181 formed on the surface (e.g., entire surface) of the substrate 110 using a CVD method or a PECVD method. In an embodiment, the active material layer may be an amorphous silicon layer. An amorphous silicon pattern 130 as illustrated in FIG. 7 may be formed on the buffer layer 181 by patterning the amorphous silicon layer deposited on the surface (e.g., entire surface) of the buffer layer 181.

Figure 8:
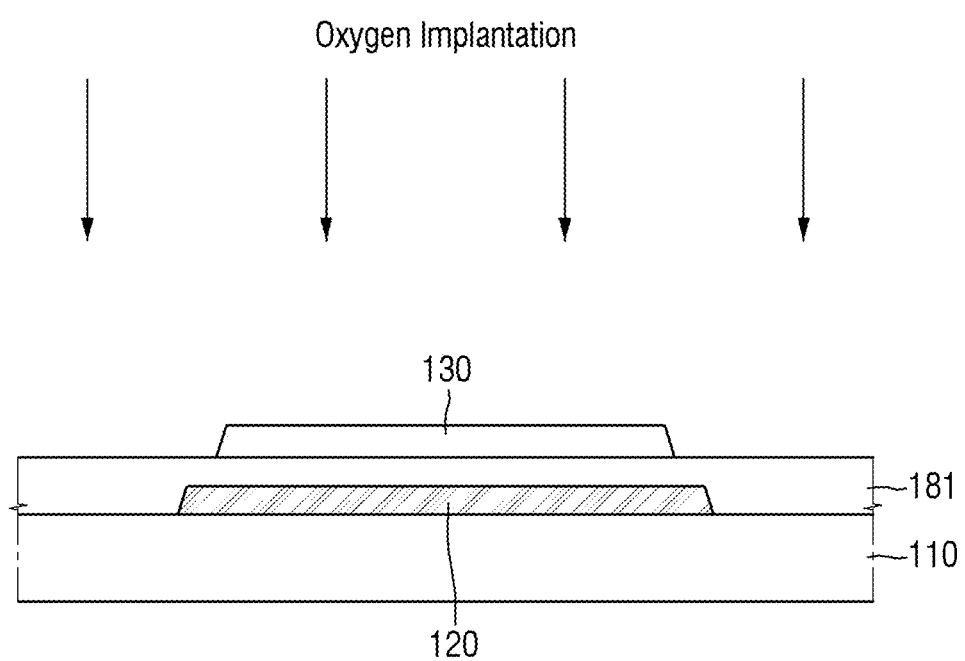

Referring to FIG. 8, oxygen may be implanted into a lower portion of the amorphous silicon pattern 130 formed on the buffer layer 181. Specifically, oxygen ions may be implanted into the desired position of the amorphous silicon pattern 130 using an ion implantation process. For example, the concentration and energy of the oxygen ions may be adjusted using an oxygen implantation process to position the oxygen ions at positions close to an upper surface of the buffer layer 181 at the lower portion of the amorphous silicon pattern 130, for example, inside the amorphous silicon pattern 130.

Figure 9:
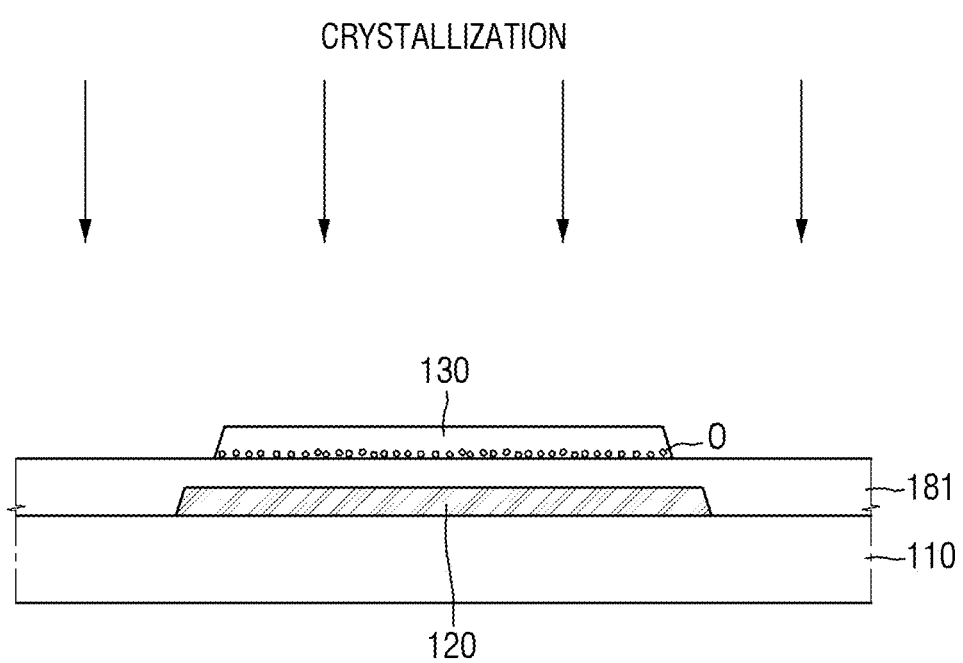
Figure 10:
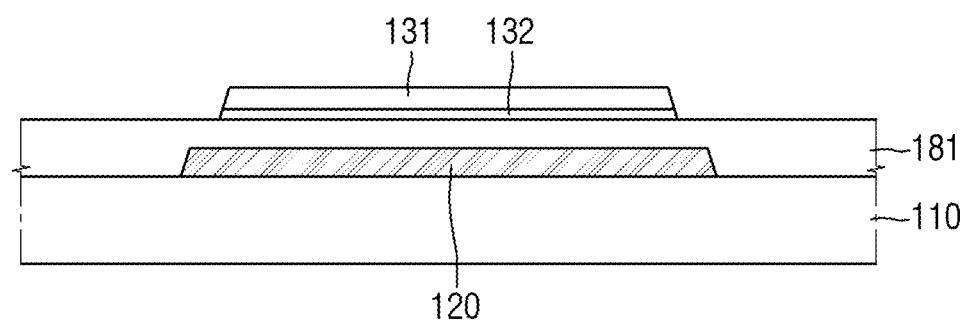

Referring to FIGS. 9 and 10, the amorphous silicon pattern 130 having oxygen ions O disposed on the lower portion thereof may be divided into an active layer 131 including crystalline silicon and a lower gate insulating film 132.

Specifically, an active layer 131 including the crystalline silicon may be formed by crystallizing an upper portion of the amorphous silicon pattern 130 on which the oxygen ions O may not be disposed. For example, oxygen ions O may be disposed in the lower portion of the amorphous silicon pattern 130 and oxygen ions O may not be disposed in the upper portion of the amorphous silicon pattern. 130. The lower gate insulating film 132 may be formed by combining the amorphous silicon layer with the oxygen ions in the lower portion of the amorphous silicon pattern 130 due to heat generated in case that the crystallization is performed to form the upper portion of the amorphous silicon pattern 130, as a crystalline silicon layer 131 (the active layer). For example, in the crystallization operation, the amorphous silicon pattern 130 may be divided into the upper portion thereof as the active layer 131 and the lower portion thereof as the lower gate insulating film 132. The amorphous silicon pattern 130 including amorphous silicon may be crystallized into the active layer 131 including the crystalline silicon using a crystallization method among a sequential lateral solidification (SLS) method, an excimer laser annealing (ELA) method, and a metal-induced lateral crystallization (MILC) method, but the disclosure is not limited thereto.

In an embodiment, the active layer 131 may be formed of a crystalline silicon layer, and the lower gate insulating film may be formed of SiOx. For example, in the crystallization process, the amorphous silicon pattern 130 may be formed in the structure of crystalline silicon/SiOx films. The temperature for bonding the oxygen ions and the amorphous silicon layer may be about 460° C. or more, but the disclosure is not limited thereto.

Figure 11:
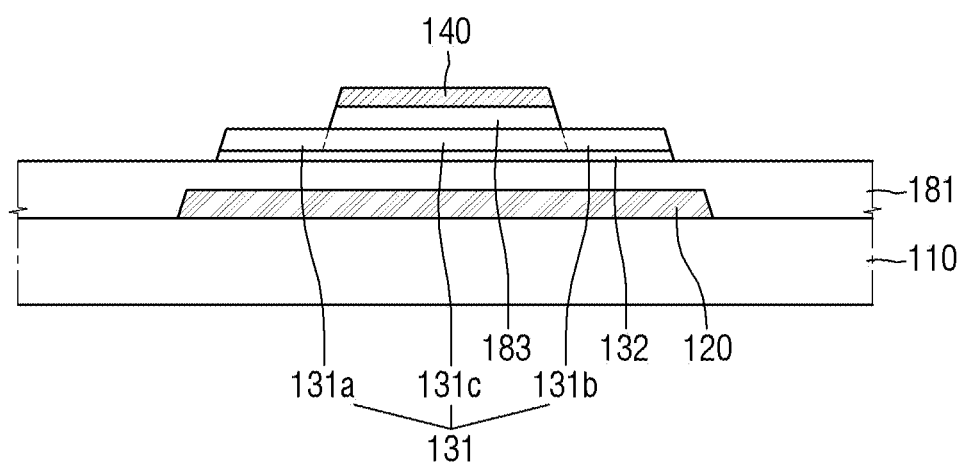

Referring to FIG. 11, a patterned upper gate insulating film 183 and an upper gate conductive layer 140 may be formed on the active layer 131. Thereafter, a first doped region 131a and a second doped region 131b may be formed on both sides of the active layer 131.

Specifically, the patterned upper gate insulating film 183 and the upper gate conductive layer 140 may be formed by a mask process. Specifically, a material layer for an upper gate insulating film may be deposited on the surface (e.g., entire surface) of the buffer layer 181 on which the active layer 131 and the lower gate insulating film 132 are formed. A material layer for an upper gate conductive layer may be deposited on the material layer for an upper gate insulating film. A photoresist pattern may be formed by coating a photoresist layer on the material layer for an upper gate conductive layer and performing exposure and development, and the material layer for an upper gate conductive layer and the material layer for an upper gate insulating film may be sequentially etched using the photoresist pattern as an etch mask. Thereafter, the photoresist pattern may be removed by a stripping or ashing process.

Impurities may be implanted into both sides of the active layer 131 exposed by the upper gate conductive layer 140 through the ion implantation process using the upper gate conductive layer 140 as a mask, thereby forming the first doped region 131a and the second doped region 131b. Accordingly, a region of the active layer 131, which overlaps the upper gate conductive layer 140, for example, the channel region 131c may be made of polycrystalline silicon not doped with impurities, and the first doped region 131a and the second doped region 131b may be made of polycrystalline silicon doped with impurities.

Figure 12:
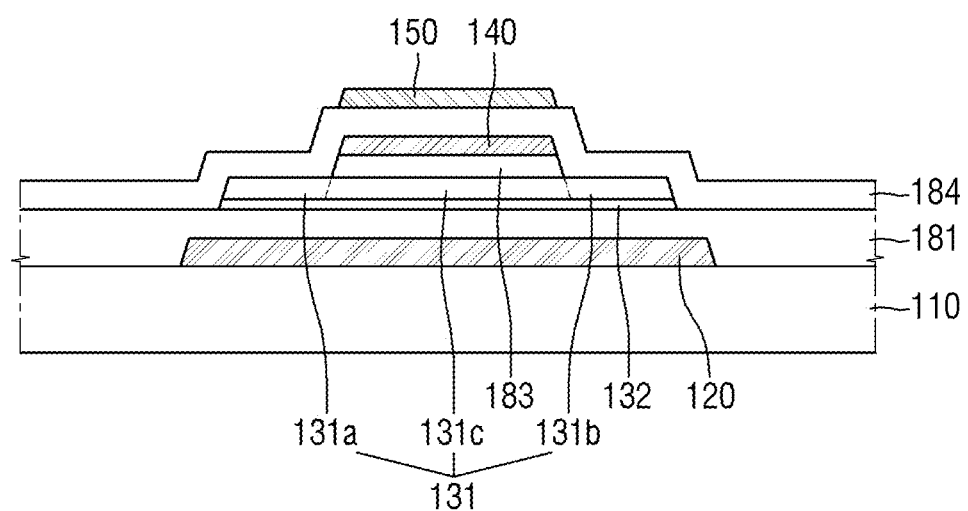

Referring to FIG. 12, a first interlayer insulating film 184 may be formed on the active layer 131, on which the upper gate conductive layer 140 may be formed, and the buffer layer 181, and a patterned first conductive layer 150 may be formed on the first interlayer insulating film 184. The first conductive layer 150 may be formed through a mask process. For example, a material layer for a first conductive layer may be deposited on the surface (e.g., entire surface) of the first interlayer insulating film 184 deposited on the surface (e.g., entire surface) of the buffer layer 181, and may be patterned through a photolithography process to form the first conductive layer 150 as illustrated in FIG. 12.

Figure 13:
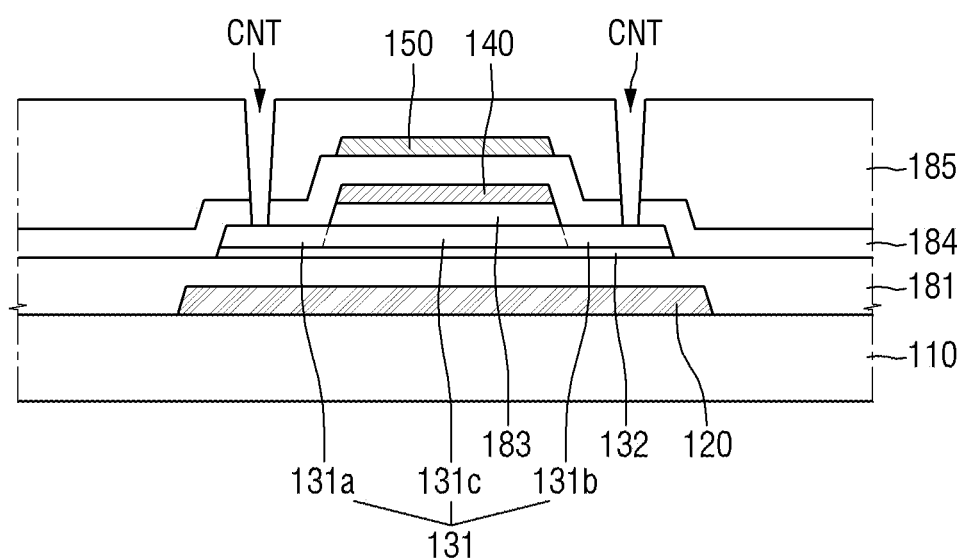

Referring to FIG. 13, a second interlayer insulating film 185 may be stacked on the first interlayer insulating film 184 on which the first conductive layer 150 may be formed, and contact holes CNT exposing some of the active layer 131, for example, the first doped region 131a and the second doped region 131b of the active layer 131, may be formed. The process of forming the contact holes CNT may be performed by a mask process. For example, an insulating layer for a second interlayer insulating film may be deposited on the surfaces (e.g., entire surfaces) of the first conductive layer 150 and the first interlayer insulating film 184. Thereafter, a photoresist pattern exposing some of the first doped region 131a and the second doped region 131b of the active layer 131 may be formed on the insulating layer for a second interlayer insulating film, and the first interlayer insulating film 184 and the insulating layer for a second interlayer insulating film may be etched using the photoresist pattern as an etch mask to form the contact holes CNT exposing some of the active layer 131 (the first doped region 131a and the second doped region 131b).

Figure 14:
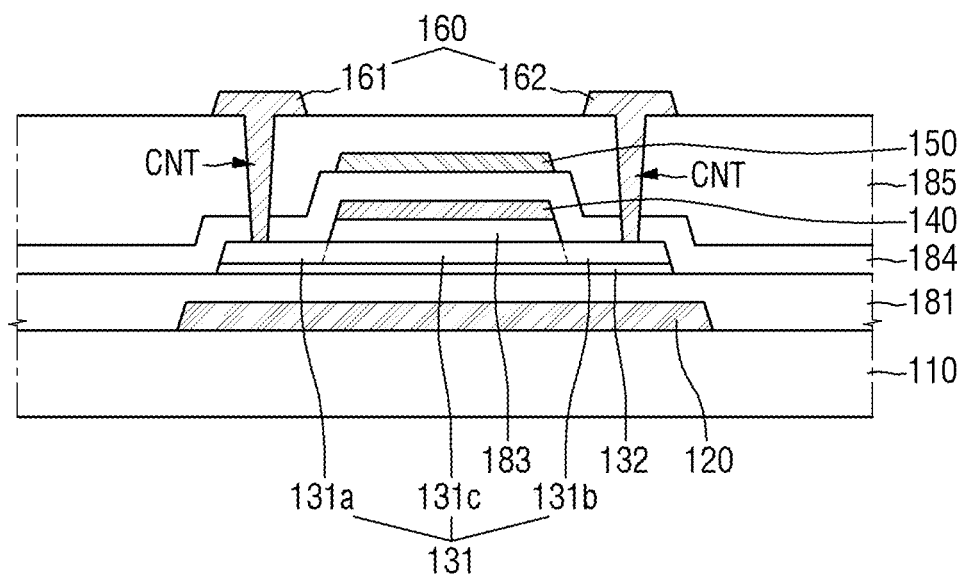

Referring to FIG. 14, a patterned second conductive layer 160 may be formed on the second interlayer insulating film 185. The patterned second conductive layer 160 may be formed by a mask process. For example, a material layer for a second conductive layer may be deposited on the surface (e.g., entire surface) of the second interlayer insulating film 185. During the deposition operation, the material layer for a second conductive layer may be deposited on interiors of the contact holes CNT to be electrically connected to the first doped region 131a and the second doped region 131b of the active layer 131. A photoresist pattern may be formed by coating a photoresist layer on the material layer for a second conductive layer and performing exposure and development, and the material layer for a second conductive layer may be etched using the photoresist pattern as an etch mask. Thereafter, the photoresist pattern may be removed through a stripping or ashing process to complete the patterned second conductive layer 160 as illustrated in FIG. 14.

Referring to FIG. 5 again, a passivation layer 182 and a via layer 186 may be formed on the second interlayer insulating film 185 on which the patterned second conductive layer 160 may be formed, and a pixel electrode 171, a pixel definition film 187, a light-emitting layer 172, and a common electrode 173 may be formed on the via layer 186.

Specifically, the passivation layer 182 may be formed on the patterned second conductive layer 160, for example, on the first electrode 161 and the second electrode 162 of the driving transistor DT. The passivation layer 182 may be formed on the second interlayer insulating film 185 exposed by the first electrode 161 and the second electrode 162 of the driving transistor DT. Thereafter, the via layer 186 may be formed on the passivation layer 182.

The patterned pixel electrode 171 may be formed on the via layer 186. The patterned pixel electrode 171 may be formed by a mask process. Specifically, a material layer for a first electrode may be deposited on the surface (e.g., entire surface) of the via layer 186. A photoresist pattern having a pattern shape of the pixel electrode 171 to be left may be formed by coating a photoresist layer on the material layer for a first electrode and performing exposure and development. Thereafter, the material layer for a first electrode may be etched using the photoresist pattern as an etch mask. The etching of the material layer for a first electrode may be performed by wet etching, but is not limited thereto.

The patterned pixel definition film 187 may be formed on the via layer 186 on which the patterned pixel electrode 171 may be formed. The pixel definition film 187 may be made of, for example, an organic material including a photosensitive material. The patterned pixel definition film 187 may be formed by coating an organic material layer for the pixel definition film 187 and performing exposure and development. The pixel definition film 187 may be formed along a boundary of a subpixel SP and may partially overlap the pixel electrode 171.

The light-emitting layer 172 may be formed on the pixel definition film 187 and a portion of the pixel electrode 171 that may not be covered by the pixel definition film 187. Thereafter, the common electrode 173 may be formed on the light-emitting layer 172 and the pixel definition film 187.

As described above, according to a method of fabricating the display device according to an embodiment, the oxygen ions may be implanted into the lower portion of the amorphous silicon layer and the amorphous silicon layer may be crystallized into the crystalline silicon layer so that the upper portion of the amorphous silicon layer may be formed of the crystalline silicon layer and the lower portion of the amorphous silicon layer may be formed of SiOx by heat generated in the crystallization process. For example, the oxygen ions may be implanted into the amorphous silicon pattern to divide the upper and lower portions of the amorphous silicon pattern into the active layer and the lower gate insulating film, respectively. Interface characteristics of the lower gate insulating film, which may be formed of SiOx and disposed below the crystalline silicon layer, may be improved by implanting the oxygen ions into the lower portion of the amorphous silicon layer while adjusting the concentration of the oxygen ions. Accordingly, since the interface characteristics of the lower gate insulating film disposed on the lower portion of the active layer are improved, the leakage current resulting from the lower interface may be easily controlled.

A thickness of the lower gate insulating film, which may be formed of SiOx and disposed below the crystalline silicon layer, may be varied by implanting the oxygen ions into the lower portion of the amorphous silicon layer while adjusting the concentration of the oxygen ions. The thicknesses of the active layer and the lower gate insulating film may be adjusted by adjusting the concentration of the oxygen ions in the process of dividing the amorphous silicon layer formed to have a same thickness. Accordingly, a channel region of the active layer having a reduced thickness may be formed by adjusting the thickness of the lower gate insulating film.

Hereinafter, another embodiment will be described. In the following embodiment, redundant description of the same elements as those described above will be omitted or simplified, and differences will be described.

Figure 15:
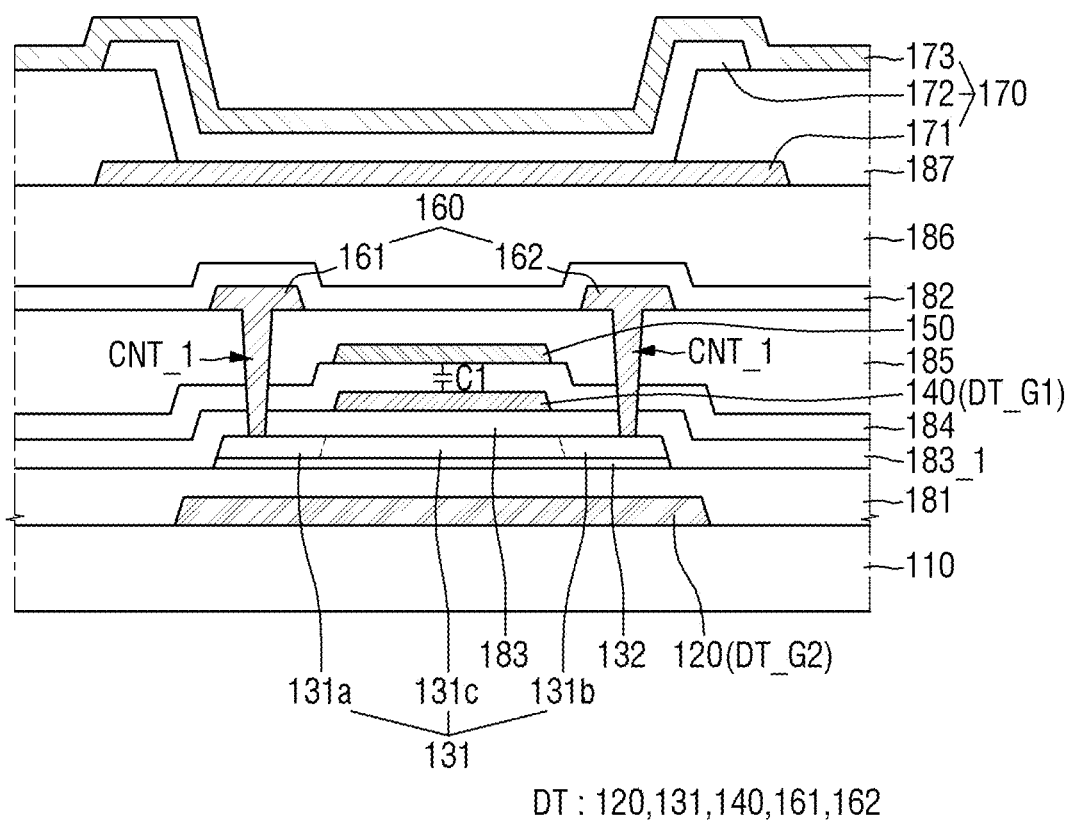
FIG. 15 is a schematic cross-sectional view of a display panel of a display device according to another embodiment.

FIG. 15 is a schematic cross-sectional view of a display panel of a display device according to another embodiment.

Referring to FIG. 15, the structure of an upper gate insulating film of the display device according to an embodiment may be different from that of the embodiment described with reference to FIG. 5.

Specifically, an upper gate insulating film 183_1 may be disposed on the surface (e.g., entire surface) of a buffer layer 181 on which an active layer 131 may be formed. Accordingly, the upper gate insulating film 183_1 of a display device 10 according to an embodiment may be disposed to completely cover the active layer 131. Specifically, the upper gate insulating film 183_1 may be disposed to overlap a first doped region 131a and a second doped region 131b of the active layer 131 in a thickness direction. The upper gate insulating film 183_1 may cover sidewalls of a lower gate insulating film 132 disposed below the active layer 131.

A second conductive layer 160 according to an embodiment may be electrically connected to the active layer 131 through contact holes CNT_1 passing through the upper gate insulating film 183_1, a first interlayer insulating film 184, and a second interlayer insulating film 185. Specifically, a first electrode 161 (or a first source/drain electrode) of a driving transistor DT and a second electrode 162 (or a second source/drain electrode) of the driving transistor DT may be electrically connected to doped regions 131a and 131b of the active layer 131 through the contact holes CNT_1.

More specifically, the first electrode 161 of the driving transistor DT may be electrically connected to the first doped region 131a of the active layer 131 through the contact hole CNT_1 exposing the first doped region 131a of the active layer 131 by passing through the first and second interlayer insulating films 184 and 185 and the upper gate insulating film 183_1. The second electrode 162 of the driving transistor DT may be electrically connected to the second doped region 131b of the active layer 131 through the contact hole CNT_1 exposing the second doped region 131b of the active layer 131 by passing through the first and second interlayer insulating films 184 and 185 and the upper gate insulating film 183_1. Even in such a case, a region in which the first electrode 161 of the driving transistor DT and the first doped region 131a of the active layer 131 may be connected, and a region in which the second electrode 162 of the driving transistor DT and the second doped region 131b of the active layer 131 may be electrically connected may overlap the lower gate insulating film 132.

FIGS. 16 to 24 are schematic cross-sectional views illustrating process operations of a method of fabricating the display device of FIG. 15. Hereinafter, the method of fabricating the display device will be described with reference to FIGS. 6, 7, and 15 to 24.

Figure 16:
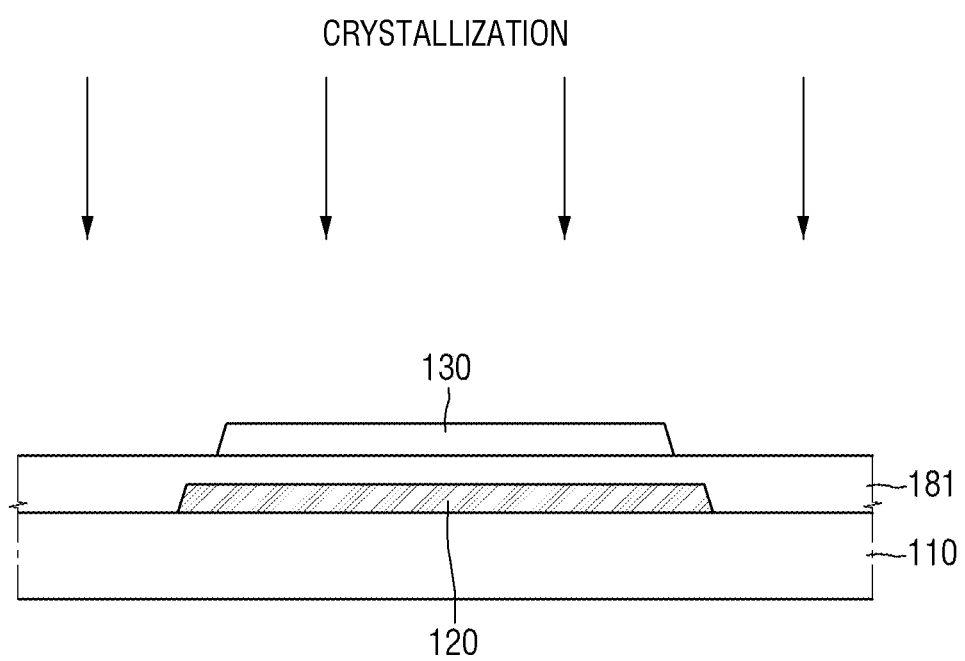
FIGS. 16 to 24 are schematic cross-sectional views illustrating process operations of a method of fabricating the display device of FIG. 15.

Referring to FIGS. 6, 7, and 16, a lower gate conductive layer 120 (e.g., a patterned lower gate conductive layer) may be formed on a substrate 110. A buffer layer 181 may be formed on the surface (e.g., entire surface) of the substrate 110 on which the lower gate conductive layer 120 may be formed. An amorphous silicon pattern 130 may be formed on the buffer layer 181 by patterning an amorphous silicon layer deposited on the surface (e.g., entire surface) of the buffer layer 181. As illustrated in FIG. 16, the amorphous silicon may be crystallized to form a crystalline silicon layer.

Figure 17:
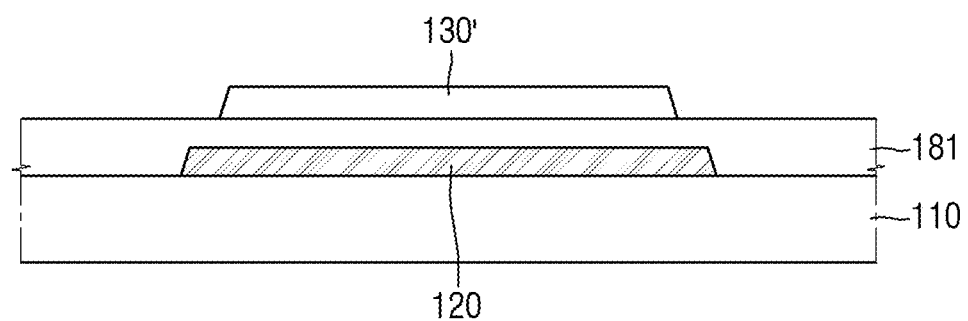

Referring to FIG. 17, the amorphous silicon pattern 130 may be formed into a crystalline silicon pattern 130' including crystalline silicon by crystallizing the amorphous silicon through a crystallization operation.

Figure 18:
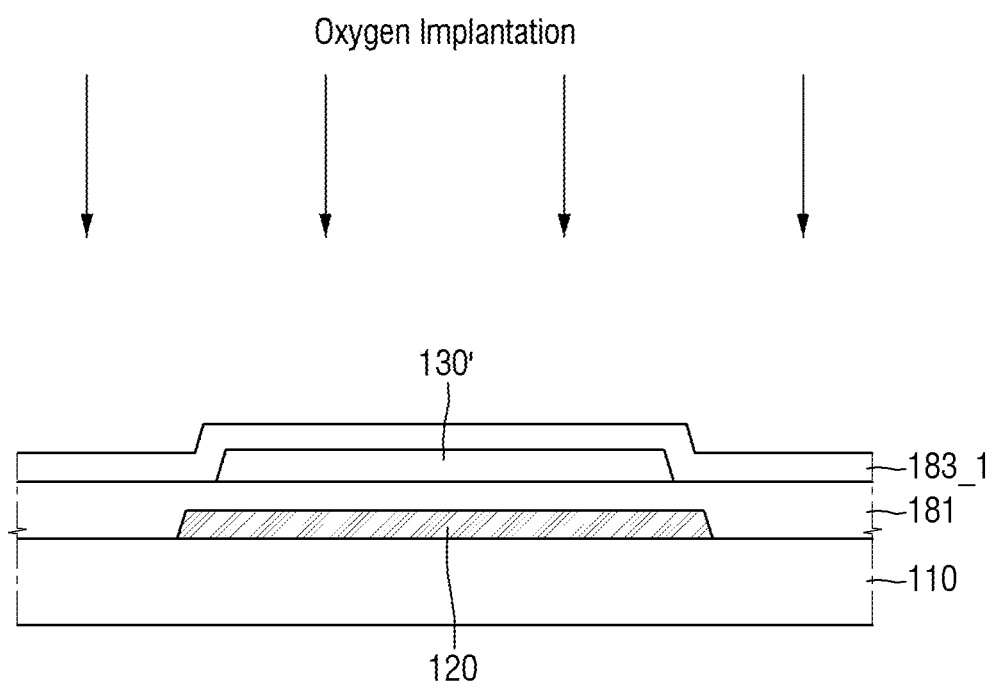

Referring to FIG. 18, the upper gate insulating film 183_1 may be formed on the buffer layer 181 on which the crystalline silicon pattern 130' may be formed, and oxygen may be implanted into a lower portion of the crystalline silicon pattern 130'.

Specifically, the upper gate insulating film 183_1 may be deposited on the surface (e.g., entire surface) of the buffer layer 181 on which the crystalline silicon pattern 130' may be formed. Oxygen ions may be implanted into the lower portion of the crystalline silicon pattern 130' interposed between the upper gate insulating film 183_1 and the buffer layer 181 using an ion implantation process. As described above, the concentration and energy of the oxygen ions may be adjusted using an oxygen implantation process to position the oxygen ions at positions close to an upper surface of the buffer layer 181 at the lower portion of crystalline silicon pattern 130', for example, inside the crystalline silicon pattern 130'.

Figure 19:
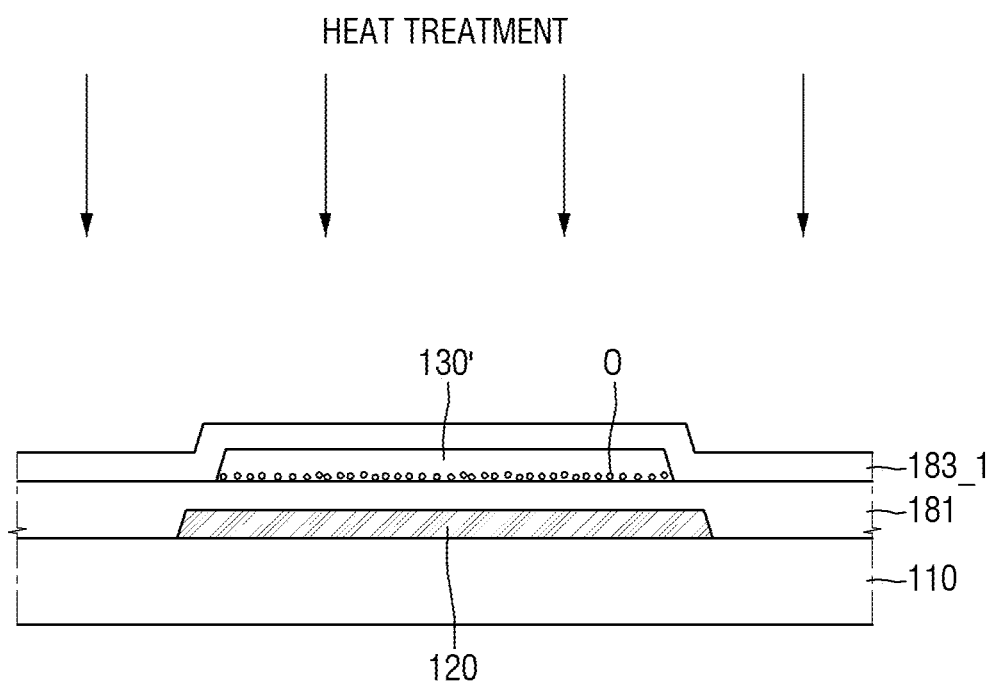
Figure 20:
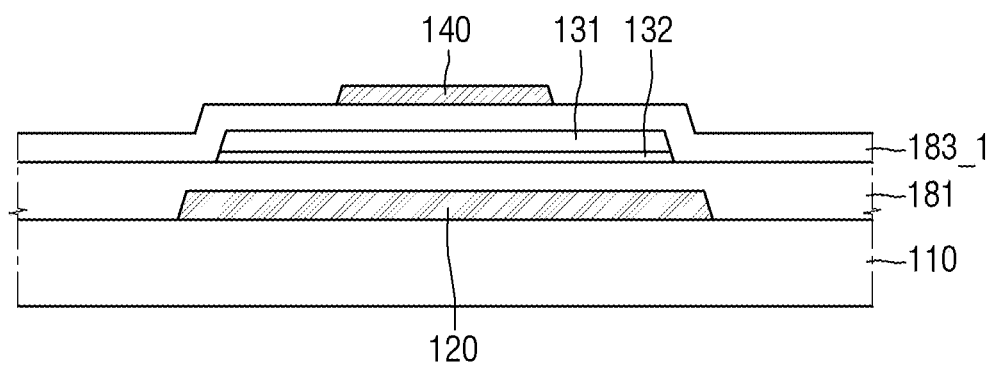

Referring to FIGS. 19 and 20, the crystalline silicon pattern 130' having oxygen ions O disposed on the lower portion thereof may be divided into an active layer 131 including crystalline silicon and a lower gate insulating film 132.

Specifically, as illustrated in FIG. 19, the crystalline silicon pattern 130' having the oxygen ions O disposed on the lower portion thereof may be thermally treated so that the oxygen ions O and the crystalline silicon disposed on the lower portion of the crystalline silicon pattern 130' may be combined. Accordingly, the crystalline silicon and the oxygen ions may be combined to form the lower gate insulating film 132 on the lower portion of the crystalline silicon pattern 130', on which the oxygen ions O may be disposed by the heat treatment. For example, in the heat treatment operation, the crystalline silicon pattern 130' may be divided into the upper portion thereof as the active layer 131 and the lower portion thereof as the lower gate insulating film 132. In an embodiment, the active layer 131 may be formed of the crystalline silicon layer, and the lower gate insulating film may be formed of SiOx. The heat treatment operation may be omitted.

Referring to FIG. 20, a patterned upper gate conductive layer 140 may be formed on the upper gate insulating film 183_1.

Specifically, the patterned upper gate conductive layer 140 may be formed by a mask process. Specifically, a material layer for an upper gate conductive layer may be deposited on the upper gate insulating film 183_1 formed on the surface (e.g., entire surface) of the active layer 131 and a portion of the buffer layer 181 exposed by the active layer 131. A photoresist pattern may be formed by coating a photoresist layer on the material layer for an upper gate conductive layer and performing exposure and development, and the material layer for an upper gate conductive layer may be etched using the photoresist pattern as an etch mask. Thereafter, the photoresist pattern may be removed by a stripping or ashing process.

Figure 21:
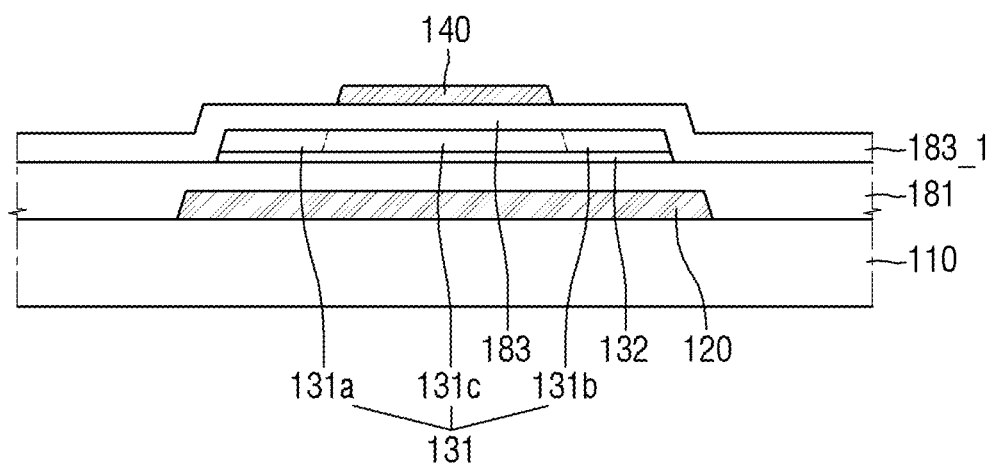

Referring to FIG. 21, some of the active layer 131, for example, a first doped region 131a and a second doped region 131b of the active layer 131, may be formed.

Specifically, impurities may be implanted into both sides of the active layer 131 exposed by the upper gate conductive layer 140 through the ion implantation process using the upper gate conductive layer 140 as a mask, thereby forming the first doped region 131a and the second doped region 131b on the surface (e.g., entire surface) of the buffer layer 181. Accordingly, a region of the active layer 131, which may overlap the upper gate conductive layer 140, for example, the channel region 131c of the active layer 131, may be made of crystalline silicon not doped with impurities, and the first doped region 131a and the second doped region 131b may be made of crystalline silicon doped with impurities.

Figure 22:
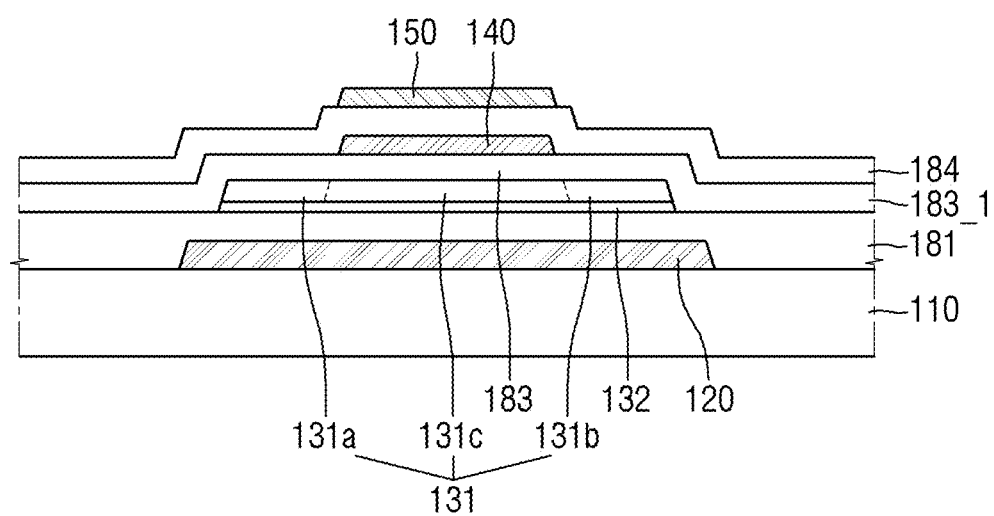

Referring to FIG. 22, a first interlayer insulating film 184 may be formed on the active layer 131, on which the upper gate conductive layer 140 may be formed, and the buffer layer 181, and a patterned first conductive layer 150 may be formed on the first interlayer insulating film 184. The first conductive layer 150 may be formed by a mask process. For example, a material layer for a first conductive layer may be deposited on the surface (e.g., entire surface) of the first interlayer insulating film 184 deposited on the surface (e.g., entire surface) of the buffer layer 181, and patterned through a photolithography process to form the first conductive layer 150. The operation of forming the first interlayer insulating film 184 may include a heat treatment operation. Accordingly, the oxygen ions O, which may not be bonded and may remain among the oxygen ions O disposed on the lower portion of the crystalline silicon pattern 130', may be combined with the crystalline silicon by the heat treatment included in the operation of forming the first interlayer insulating film 184. Accordingly, the oxygen ions O disposed on the lower portion of the crystalline silicon pattern 130' and the crystalline silicon may be combined to form the lower gate insulating film 132 by the heat treatment performed in the operation of forming the first interlayer insulating film 184 without including the separate heat treatment process described above in FIG. 19.

Figure 23:
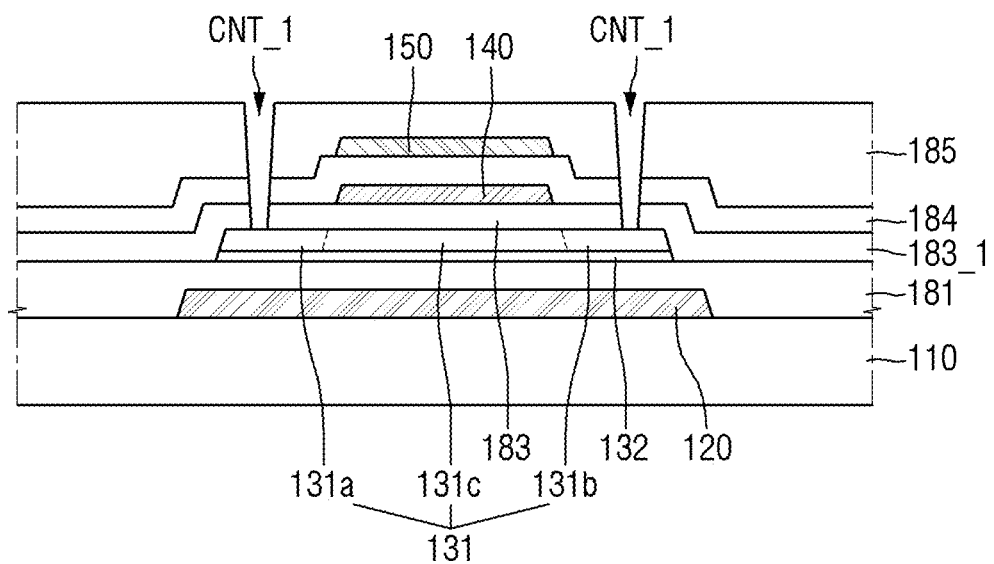

Referring to FIG. 23, a second interlayer insulating film 185 may be stacked on the first interlayer insulating film 184 on which the first conductive layer 150 may be formed, and contact holes CNT_1 exposing some of the active layer 131, for example, the first doped region 131a and the second doped region 131b of the active layer 131, may be formed. The process of forming the contact holes CNT_1 may be performed by a mask process. For example, an insulating layer for a second interlayer insulating film may be deposited on the surfaces (e.g., entire surfaces) of the upper gate conductive layer 140 and the first interlayer insulating film 184. Thereafter, a photoresist pattern exposing some of the first doped region 131a and the second doped region 131b of the active layer 131 may be formed on the insulating layer for a second interlayer insulating film, and the first interlayer insulating film 184, the upper gate insulating film 183_1, and the insulating layer for a second interlayer insulating film may be etched using the photoresist pattern as an etch mask to form the contact holes CNT_1 exposing some of the active layer 131 (the first doped region 131a and the second doped region 131b).

Figure 24:
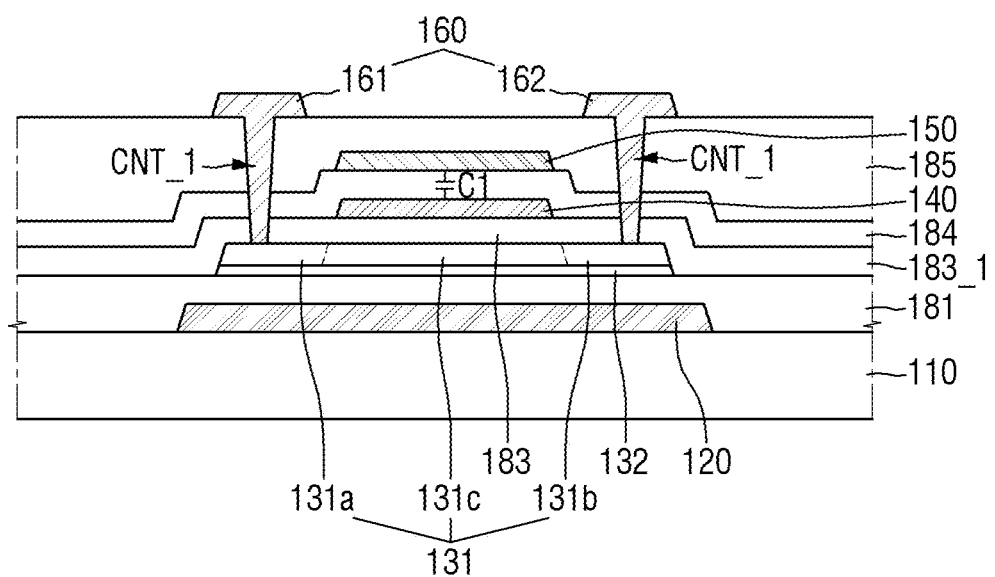

Referring to FIG. 24, a patterned second conductive layer 160 may be formed on the second interlayer insulating film 185. The patterned second conductive layer 160 may be formed by a mask process. For example, a material layer for a second conductive layer may be deposited on the surface (e.g., entire surface) of the second interlayer insulating film 185. In the deposition operation, the material layer for a second conductive layer may be deposited on interiors of the contact holes CNT_1 passing through the second interlayer insulating film 185, the first interlayer insulating film 184, and the upper gate insulating film 183_1 to be electrically connected to the first doped region 131a and the second doped region 131b of the active layer 131. A photoresist pattern may be formed by coating a photoresist layer on the material layer for a second conductive layer and performing exposure and development, and the material layer for a second conductive layer may be etched using the photoresist pattern as an etch mask. The photoresist pattern may be removed through a stripping or ashing process to complete the patterned second conductive layer 160 as illustrated in FIG. 24.

According to a display device and a method of fabricating the same according to an embodiment, interface characteristics of a lower gate insulating film disposed below an active layer can be improved.

According to a display device and a method of fabricating the same according to an embodiment, an amorphous silicon layer can be divided into an active layer and a lower gate insulating film by implanting oxygen into a lower portion of the amorphous silicon layer while adjusting the concentration of the oxygen to adjust the thickness of the lower gate insulating film so that a channel region of the active layer with a reduced thickness can be easily formed.

Effects according to the embodiments are not limited by the content exemplified above, and more various effects are included in the specification.

Although embodiments of the invention have been disclosed for illustrative purposes, those skilled in the art will appreciate that various modifications, additions and substitutions are possible, without departing from the scope and spirit of the invention as disclosed in the accompanying claims, including any equivalents.

In concluding the detailed description, those skilled in the art will appreciate that many variations and modifications can be made to the embodiments without substantially departing from the principles of the invention. Therefore, the disclosed embodiments of the invention are used in a generic and descriptive sense only and not for purposes of limitation.

What is claimed is:

1. A method of fabricating a display device, the method comprising:
   forming a crystalline silicon pattern on a substrate;
   forming an upper gate insulating film on the crystalline silicon pattern; and
   dividing the crystalline silicon pattern into a lower gate insulating film and an active layer disposed on the lower gate insulating film, the active layer including crystalline silicon, the dividing of the crystalline silicon pattern including:
forming the active layer above the lower gate insulating film to completely cover an upper surface of the lower gate insulating film; and
aligning at least one inclined sidewall of the active layer with at least one inclined sidewall of the lower gate insulating film,
wherein the inclined sidewall of the active layer and the inclined sidewall of the lower gate insulating film are inclined with respect to an upper surface of the substrate,
wherein the lower gate insulating film is disposed between the active layer and the substrate.

2. The method of claim 1, wherein the forming of the crystalline silicon pattern on the substrate includes:
forming an amorphous silicon layer on the substrate;
patterning the amorphous silicon layer to form an amorphous silicon pattern; and
crystallizing the amorphous silicon pattern to form the crystalline silicon pattern.

3. The method of claim 1, wherein the dividing of the crystalline silicon pattern includes:
implanting oxygen into a lower portion of the crystalline silicon pattern; and
dividing the lower portion of the crystalline silicon pattern from an upper portion of the crystalline silicon pattern by forming the lower portion of the crystalline silicon pattern as the lower gate insulating film through heat treatment, the upper portion of the crystalline silicon pattern being the active layer including the crystalline silicon.

4. The method of claim 3, further comprising, prior to the forming of the crystalline silicon pattern on the substrate:
forming a lower gate conductive layer on the substrate; and
forming a buffer layer on the lower gate conductive layer and the substrate, wherein
the lower gate conductive layer is disposed below the crystalline silicon pattern to overlap the crystalline silicon pattern, and
the buffer layer is disposed on an entire surface of the substrate and is disposed between the crystalline silicon pattern and the lower gate conductive layer.

5. The method of claim 4, wherein
the lower gate insulating film includes silicon oxide,
the buffer layer includes silicon oxide, and
an oxygen content of the lower gate insulating film is higher than an oxygen content of the buffer layer.

6. A method of fabricating a display device, the method comprising:
forming a crystalline silicon pattern on a substrate;
forming an upper gate insulating film on the crystalline silicon pattern; and
dividing the crystalline silicon pattern into a lower gate insulating film and an active layer disposed on the lower gate insulating film, the active layer including crystalline silicon, the dividing of the crystalline silicon pattern including:
forming the active layer above the lower gate insulating film to completely cover an upper surface of the lower gate insulating film; and
aligning at least one of sidewalls of the active layer with at least one of sidewalls of the lower gate insulating film,
wherein the dividing of the crystalline silicon pattern includes:
implanting oxygen into a lower portion of the crystalline silicon pattern; and
dividing the lower portion of the crystalline silicon pattern from an upper portion of the crystalline silicon pattern by forming the lower portion of the crystalline silicon pattern as the lower gate insulating film through heat treatment, the upper portion of the crystalline silicon pattern being the active layer including the crystalline silicon.

7. The method of claim 6, further comprising, prior to the forming of the crystalline silicon pattern on the substrate:
forming a lower gate conductive layer on the substrate; and
forming a buffer layer on the lower gate conductive layer and the substrate, wherein the lower gate conductive layer is disposed below the crystalline silicon pattern to overlap the crystalline silicon pattern, and
the buffer layer is disposed on an entire surface of the substrate and is disposed between the crystalline silicon pattern and the lower gate conductive layer.

8. The method of claim 7, wherein
the lower gate insulating film includes silicon oxide,
the buffer layer includes silicon oxide, and
an oxygen content of the lower gate insulating film is higher than an oxygen content of the buffer layer.

9. The method of claim 6, wherein the forming of the crystalline silicon pattern on the substrate includes:
forming an amorphous silicon layer on the substrate;
patterning the amorphous silicon layer to form an amorphous silicon pattern; and
crystallizing the amorphous silicon pattern to form the crystalline silicon pattern.

* * * * *